(12) United States Patent
Morimoto et al.

(10) Patent No.: US 11,163,325 B2
(45) Date of Patent: Nov. 2, 2021

(54) POWER SUPPLY DEVICE

(71) Applicant: Yazaki Corporation, Tokyo (JP)

(72) Inventors: Mitsuaki Morimoto, Shizuoka (JP);
Kazuo Sugimura, Shizuoka (JP);
Kazuya Tsubaki, Shizuoka (JP);
Eiichiro Oishi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 92 days.

(21) Appl. No.: 16/726,162

(22) Filed: Dec. 23, 2019

(65) Prior Publication Data

US 2020/0233441 A1 Jul. 23, 2020

(30) Foreign Application Priority Data

Jan. 23, 2019 (JP) .............................. JP2019-008971

(51) Int. Cl.
| | | |
|---|---|---|
| *G05F 1/571* | (2006.01) | |
| *G05F 1/573* | (2006.01) | |
| *G05F 1/577* | (2006.01) | |
| *H02J 1/08* | (2006.01) | |
| *B60R 16/03* | (2006.01) | |
| *B60R 16/033* | (2006.01) | |
| *G01R 19/165* | (2006.01) | |
| *H02H 3/087* | (2006.01) | |

(52) U.S. Cl.
CPC ............ *G05F 1/573* (2013.01); *B60R 16/033* (2013.01); *G01R 19/16528* (2013.01); *H02J 1/084* (2020.01)

(58) Field of Classification Search
CPC .... H02J 1/10; H02J 1/08–086; H02J 2310/40; H02H 9/002; H02H 3/087; B60R 16/03; B60R 16/033; B60R 16/0231; G05F 1/573; G05F 1/571; G05F 1/577; G01R 19/16528; B60L 3/0092; H03K 2217/0063; H03K 17/082
See application file for complete search history.

(56) References Cited

U.S. PATENT DOCUMENTS

| | | | |
|---|---|---|---|
| 6,127,741 A | 10/2000 | Matsuda et al. | |
| 6,552,443 B1 * | 4/2003 | Johnke | ................ B60R 16/0315 307/10.1 |
| 7,095,134 B2 * | 8/2006 | Sauer | ........................ H02J 1/00 307/10.1 |

(Continued)

FOREIGN PATENT DOCUMENTS

| | | |
|---|---|---|
| JP | 10-262330 A | 9/1998 |
| JP | 2000-23358 A | 1/2000 |
| WO | 2009/145678 A1 | 12/2009 |

*Primary Examiner* — Sisay G Tiku
(74) *Attorney, Agent, or Firm* — Kenealy Vaidya LLP

(57) ABSTRACT

In a power-supply device, a FET passes or blocks a current flowing from one side in a power-supply circuit. A current sensor detects a current flowing into the FET. A FET is coupled to the FET, and passes or blocks a current flowing from another side in the power-supply circuit. A current sensor detects a current flowing into the FET. A junction couples a load unit at a point between the FET and the FET. In each of switch units, a CPU controls the corresponding switch unit of the power-supply circuit based on the detection result detected by the corresponding current sensors.

4 Claims, 14 Drawing Sheets

(56) References Cited

U.S. PATENT DOCUMENTS

| | | | |
|---|---|---|---|
| 8,405,500 B2* | 3/2013 | Lammers | G05B 19/042 340/538.11 |
| 9,929,773 B2* | 3/2018 | Kanazawa | H04B 3/548 |
| 10,005,365 B2* | 6/2018 | Kinoshita | B60L 3/04 |
| 10,014,851 B2* | 7/2018 | Chauhan | H03K 17/687 |
| 10,284,193 B2* | 5/2019 | Morimoto | H03K 17/18 |
| 10,313,139 B2* | 6/2019 | Dwelley | H04L 12/40045 |
| 10,418,988 B2* | 9/2019 | Morimoto | H03K 17/693 |
| 10,431,973 B2* | 10/2019 | Morimoto | H02H 9/025 |
| 10,942,202 B2* | 3/2021 | Morimoto | G01R 19/0092 |
| 2003/0184326 A1* | 10/2003 | Throngnumchai | H02M 1/32 324/713 |
| 2005/0001431 A1 | 1/2005 | Sauer et al. | |
| 2016/0325777 A1* | 11/2016 | Mori | H02H 7/08 |
| 2017/0089958 A1* | 3/2017 | Guntreddi | G01R 19/0092 |
| 2018/0123578 A1* | 5/2018 | Chauhan | H03K 17/0822 |
| 2019/0173274 A1* | 6/2019 | Fukae | H01M 10/48 |
| 2020/0062200 A1* | 2/2020 | Doernbach | H03K 17/6877 |
| 2020/0216002 A1* | 7/2020 | Mazaki | H02H 7/268 |
| 2020/0233441 A1* | 7/2020 | Morimoto | H02J 1/084 |
| 2021/0013709 A1* | 1/2021 | Kang | H03K 17/90 |

* cited by examiner

POWER SUPPLY DEVICE

CROSS-REFERENCE TO RELATED APPLICATION(S)

The present application claims priority to and incorporates by reference the entire contents of Japanese Patent Application No. 2019-008971 filed in Japan on Jan. 23, 2019.

BACKGROUND OF THE INVENTION

1. Field of the Invention

The present invention relates to power-supply devices.

2. Description of the Related Art

Japanese Patent Application Laid-open No. H10-262330 discloses, as conventional power-supply devices, a power-feeding device for vehicles that supplies power to electrical parts installed in a vehicle, for example. Such a power-feeding device for vehicles includes a plurality of power distributors that distribute power to the electrical parts, a feed line that couples each power distributor in a loop shape, a battery that supplies power to each power distributor via the feed line.

For example, at the time of the occurrence of faults, such as a short circuit, the above power-supply device for vehicles described in Patent Document 1 shuts off the power-supply distributor to prevent such a fault. However, there is room for further improvement in this point.

SUMMARY OF THE INVENTION

The present invention is devised in view of the above, and the object thereof is to provide a power-supply device capable of improving fault tolerance.

In order to solve the above mentioned problem and achieve the object, a power-supply device according to one aspect of the present invention includes a power supply that supplies power; a power-supply circuit that is a circuit coupled to the power supply and includes a plurality of switch units, the switch units passing or blocking a current of the power supplied from the power supply; and a controller that controls turning on/off the switch units and controls the power-supply circuit; wherein each of the switch units include: a first switch having a first current blocker that passes or blocks a current flowing from one side in the power-supply circuit and a first current detector that detects a current flowing into the first current blocker; a second switch having a second current blocker that is coupled to the first current blocker and passes or blocks a current flowing from another side in the power-supply circuit and a second current detector that detects a current flowing into the second current blocker; and a junction that couples a load unit at a point between the first current blocker and the second current blocker, and in each of the switch units, the controller controls the power-supply circuit based on detection results detected by the corresponding first current detector and second current detector.

According to another aspect of the present invention, in the power-supply device, it is preferable that the switch unit to be controlled includes a communication unit to be controlled that is capable of communicating with the switch unit to be uncontrolled, the first current detector to be controlled detects an amperage of a current flowing into the first current blocker to be controlled, and a first current direction to be controlled that is a direction of the current flowing into the first current blocker to be controlled, the second current detector to be controlled detects an amperage of a current flowing into the second current blocker to be controlled, and a second current direction to be controlled that is a direction of the current flowing into the second current blocker to be controlled, the communication unit to be controlled receives a first current direction to be uncontrolled that is a direction of a current flowing into the first current blocker of the switch unit to be uncontrolled, and a second current direction to be uncontrolled that is a direction of a current flowing into the second current blocker of the switch unit to be uncontrolled, and the controller controls turning on/off the first current blocker to be controlled based on an amperage of the first current blocker to be controlled, the first current direction to be controlled, and the second current direction to be uncontrolled, and controls turning on/off the second current blocker to be controlled based on an amperage of the second current blocker to be controlled, the second current direction to be controlled, and the first current direction to be uncontrolled.

According to still another aspect of the present invention, in the power-supply device, it is preferable that the controller turns off the first current blocker to be controlled when an overcurrent flows into the first current blocker to be controlled and the second current direction to be uncontrolled that is different from the first current direction to be controlled is included, and turns off the second current blocker to be controlled when an overcurrent flows into the second current blocker to be controlled and the first current direction to be uncontrolled that is different from the second current direction to be controlled is included.

According to still another aspect of the present invention, in the power-supply device, it is preferable that the first switch to be controlled has a first short-circuit detector to be controlled, the first short-circuit detector being configured to detect a short circuit in the power-supply circuit, the second switch to be controlled has a second short-circuit detector to be controlled, the second short-circuit detector being configured to detect a short circuit in the power-supply circuit, the first current detector to be controlled detects an amperage of a current flowing into the first current blocker to be controlled, the second current detector to be controlled detects an amperage of a current flowing into the second current blocker to be controlled, and the controller controls turning on/off the first current blocker to be controlled based on the amperage detected by the first current detector to be controlled and a short-circuit result detected by the first short-circuit detector to be controlled, and controls turning on/off the second current blocker to be controlled based on the amperage detected by the second current detector to be controlled and a short-circuit result detected by the second short-circuit detector to be controlled.

According to still another aspect of the present invention, in the power-supply device, it is preferable that the first switch to be controlled has a first short-circuit detector to be controlled, the first short-circuit detector being configured to detect a short circuit in the power-supply circuit, the second switch to be controlled has a second short-circuit detector to be controlled, the second short-circuit detector being configured to detect a short circuit in the power-supply circuit, the first current detector to be controlled detects an amperage of a current flowing into the first current blocker to be controlled, the second current detector to be controlled detects an amperage of a current flowing into the second current blocker to be controlled, and the controller controls turning on/off the first current blocker to be controlled based on either of the amperage detected by the first current detector to be controlled or a short-circuit result detected by the first short-circuit detector to be controlled, and controls turning on/off the second current blocker to be controlled based on either of the amperage detected by the second current detector to be controlled or a short-circuit result detected by the second short-circuit detector to be controlled.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Embodiments for conducting the present invention (embodiments) will be described in detail with reference to the drawings. The present invention is not limited by the description of the following embodiments. The components described below include one that is readily conceived by those skilled in the art and one that is substantially the same as those. Furthermore, the configurations described below can be combined as necessary. Various omissions, substitutions, or changes of the configurations can be conducted without departing from the subject matter of the present invention.

Embodiment

Figure 1:
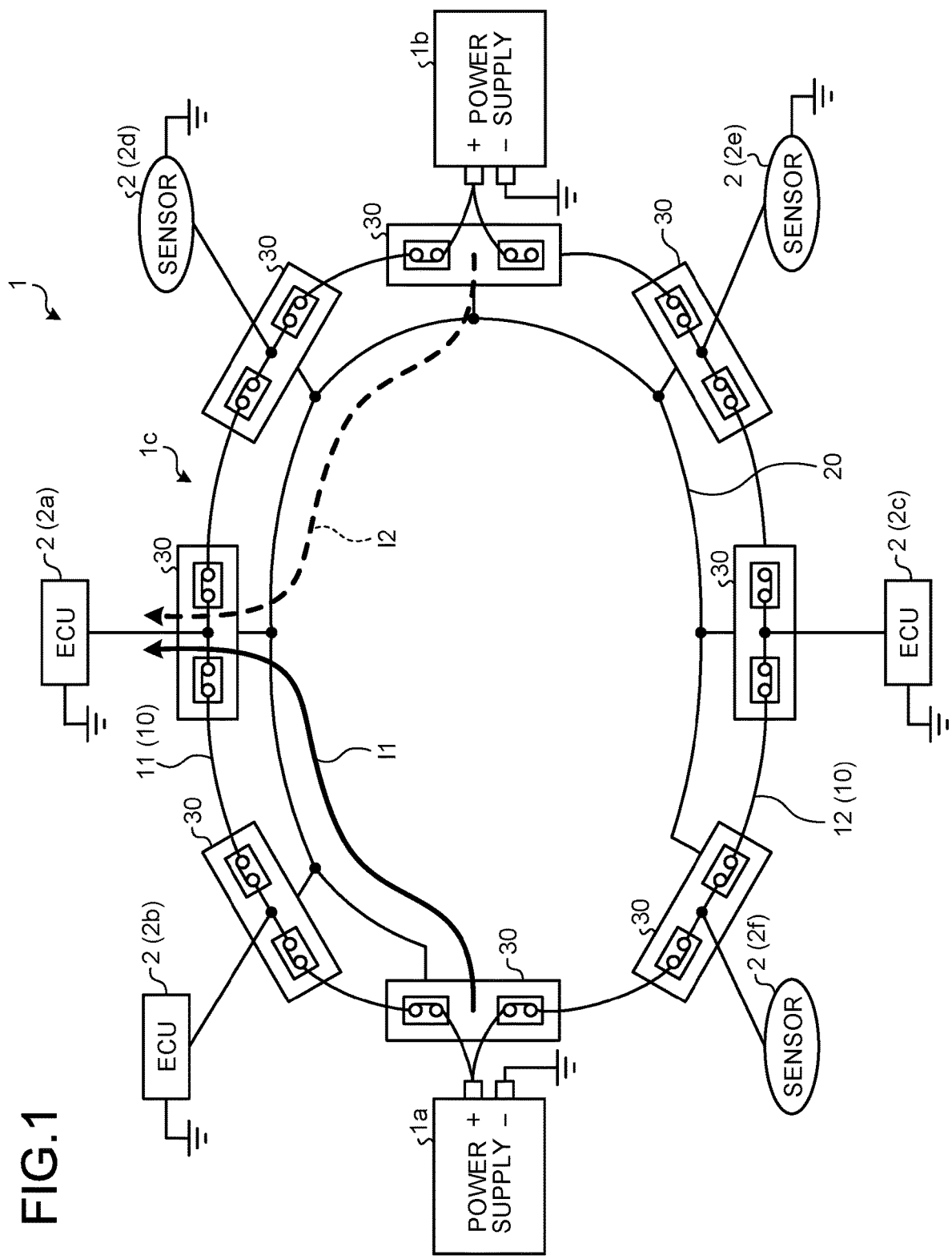
FIG. 1 is a schematic diagram illustrating a configuration example of a power-supply device according to an embodiment.
Figure 2:
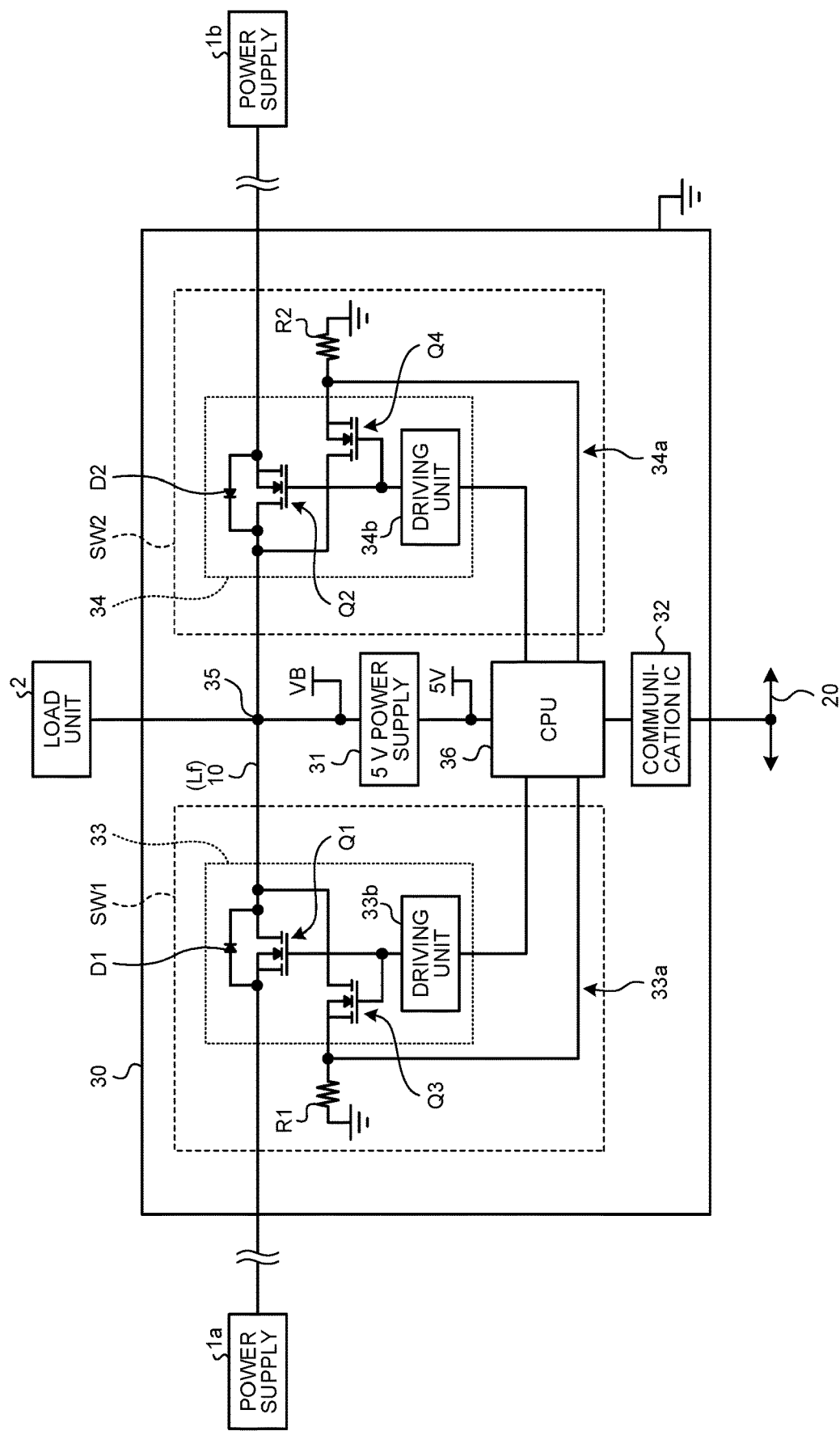
FIG. 2 is a circuit diagram illustrating a configuration example of a switch unit according to the embodiment.

A power-supply device 1 according to an embodiment will be described with reference to the drawings. FIG. 1 is a schematic diagram illustrating a configuration example of the power-supply device 1 according to the embodiment. FIG. 2 is a circuit diagram illustrating a configuration example of a switch unit 30 according to the embodiment.

As illustrated in FIG. 1, the power-supply device 1 is installed in a vehicle and supplies power to a load unit 2 of the vehicle. The load unit 2 is an electrical component that consumes relatively low power, such as electronic control units (ECUs) 2a, 2b and 2c, or sensors 2d, 2e, and 2f, for example. The power-supply device 1 includes a power supply 1a, a power supply 1b, and a power-supply circuit 1c. The power supply 1a is a storage battery that can storage direct-current power. The positive electrode of the power supply 1a is coupled to the power-supply circuit 1c. The negative electrode of the power supply 1a is coupled to the body of the vehicle for body-grounding. The power supply 1a supplies power to each load unit 2 coupled to the power-supply circuit 1c.

The power supply 1b is a storage battery that can storage direct-current power. The positive electrode of the power supply 1b is coupled to the power-supply circuit 1c. The negative electrode of the power supply 1b is coupled to the body of the vehicle for body-grounding. The power supply 1b supplies power to each load unit 2 coupled to the power-supply circuit 1c.

The power-supply circuit 1c is a circuit that carries a current and a signal. The power-supply circuit 1c includes an electric-wire unit 10, a communication wire 20, and a plurality of switch units 30.

The electric-wire unit 10 is a conductive wire that carries a current. The electric-wire unit 10 has two current paths 11 and 12. One end of the current path 11 is coupled to the positive electrode of the power supply 1a, and the other end is coupled to the positive electrode of the power supply 1b. The current path 12 has a path length that is substantially the same as that of the current path 11. One end of this path is coupled to the positive electrode of the power supply 1a, and the other end is coupled to the positive electrode of the power supply 1b. The current paths 11 and 12 are formed in a circular shape (ring shape). That is, the current paths 11 and 12 form a circular close circuit. The electric-wire unit 10 carries a current of the power supplied from the power supplies 1a and 1b to each load unit 2 via the circular current paths 11 and 12 and other elements. Even if the number of load units 2 increases, this enables the electric-wire unit 10 to supply power to each load unit 2 via the shortest path without extension of the current paths 11 and 12. In the electric-wire unit 10, this prevents the weight of the electric-wire unit 10 and a space for routing the electric-wire unit 10 from increasing.

The communication wire 20 is a conductive wire that carries a signal. The communication wire 20 couples the switch units 30 so as to mutually communicate. The communication wire 20 carries a signal output from the switch units 30.

The switch unit 30 is a branch switch that passes or blocks a current flowing into the load unit 2. The switch units 30 are provided for the electric-wire unit 10 and pass or block the current flowing into each load unit 2 via the electric-wire unit 10. As illustrated in FIG. 2, the switch unit 30 includes a control power supply (5 V power supply in FIG. 1) 31, a communication integrated circuit (IC) 32, a switch SW1, a switch SW2, and a junction 35, and a CPU 36.

The 5 V power supply 31 supplies a power supply having a voltage of 5 V. The 5 V power supply 31 is coupled to the junction 35 on a connecting wire Lf described below, which couples a FET Q1 and a FET Q2. A power-supply voltage VB of the power supply 1a or the power supply 1b is applied to this power supply. The 5 V power supply 31 transforms the applied power-supply voltage VB to a voltage of 5 V. The 5 V power supply 31, which is coupled to the CPU 36, supplies power of the transformed 5 V voltage to the CPU 36.

The communication IC 32 can communicate with the communication IC 32 of another switch unit 30. The communication IC 32, which is coupled to the CPU 36 and the communication wire 20, transmits a signal output from the CPU 36 to the communication IC32 of another switch unit 30 via the communication wire 20. Furthermore, the communication IC 32 receives a signal output from the communication IC 32 of another switch unit 30 via the communication wire 20 and outputs the received signal to the CPU 36. The communication IC 32 receives, for example, a first current direction (first current direction to be uncontrolled), which is the direction of a current flowing into the FET Q1 of another switch unit 30 and a second current direction (second current direction to be uncontrolled), which is the direction of a current flowing into the FET Q2 of another switch unit 30. The communication IC 32 of a certain switch unit 30 receives, for example, the first current direction of a current flowing into the FET Q1 of an adjacent switch unit 30 and the second current direction of a current flowing into the FET Q2 of the adjacent switch unit 30.

The switch SW1 includes an intelligent power device (IPD) 33. The IPD 33 is what is called an intelligent power device, and includes the FET Q1, a current sensor 33a, and a driving unit 33b.

The FET Q1 passes or blocks a current. For example, the FET Q1 is an N-channel-type metal-oxide-semiconductor (MOS) FET. The drain terminal of the FET Q1 is coupled to the drain terminal of the FET Q2. The source terminal of the FET Q1 is coupled to the adjacent switch unit 30. The gate terminal of the FET Q1 is coupled to the driving unit 33b. The FET Q1 has a body diode D1. The cathode terminal of the body diode D1 is coupled to the side of the load unit 2. The anode terminal of the body diode D1 is coupled to the side of the adjacent switch unit 30. The FET Q1 is turned on/off by the driving unit 33b. The FET Q1 passes a current flowing from one side of the electric-wire unit 10 to another side thereof when turned on by the drive unit 33b, and blocks the current flowing from one side of the electric-wire unit 10 to another side thereof when turned off by the drive unit 33b.

The current sensor 33a outputs the current flowing into the FET Q1. The current sensor 33a includes a FET Q3. The drain terminal of the FET Q3 is coupled to the drain terminal of the FET Q1. The source terminal of the FET Q3 is coupled to a ground via a current detection resistance R1. The gate terminal of the FET Q3 is coupled to the driving unit 33b. The current sensor 33a is coupled to the CPU 36 from a point between the source terminal of the FET Q3 and the current detection resistance R1. The FET Q3 is turned on/off by the driving unit 33b. The FET Q3 passes a current having a ratio determined relative to the current flowing into the FET Q1 as a current flowing from the drain terminal side of the FET Q1 into the current detection resistance R1 when turned on by the driving unit 33b, and blocks the current flowing from the drain terminal side of the FET Q1 into the current detection resistance R1 when turned off by the driving unit 33b. The current sensor 33a inputs, to the CPU 36, a voltage determined by the current flowing from the FET Q3 into the current detection resistance R1 and the current detection resistance R1 as a detected value of the current value.

The driving unit 33b drives the FETs Q1 and Q3. The driving unit 33b is coupled to the CPU 36, and the CPU36 outputs a command signal for turning on or off the FETs Q1 and Q3 to this unit. The driving unit 33b turns on the FETs Q1 and Q3 when an on command signal is output from the CPU 36, and turns off the FETs Q1 and Q3 when an off command signal is output from CPU36.

The switch SW2 includes an IPD 34. The IPD 34 includes a FET Q2, a current sensor 34a, and a driving unit 34b. The FET Q2 passes or blocks a current. For example, the FET Q2 is an N-channel-type MOSFET. The drain terminal of the FET Q2 is coupled to the drain terminal of the FET Q1. The source terminal of the FET Q2 is coupled to an adjacent switch unit 30. The gate terminal of the FET Q2 is coupled to the driving unit 34b. The FET Q2 has a body diode D2. The cathode terminal of the body diode D2 is coupled to the side of the load unit 2. The anode terminal of the body diode D2 is coupled to the side of the adjacent switch unit 30. The FET Q2 is turned on/off by the driving unit 34b. The FET Q2 passes a current flowing from another side of the electric-wire unit 10 into one side thereof when turned on by the driving unit 34b, and blocks the current flowing from another side of the electric-wire unit 10 into one side thereof when turned off by the driving unit 34b.

The current sensor 34a outputs the current flowing into the FET Q2. The current sensor 34a includes a FET Q4. The drain terminal of the FET Q4 is coupled to the drain terminal of the FET Q2. The source terminal of the FET Q4 is coupled to the ground via a current detection resistance R2. The gate terminal of the FET Q4 is coupled to the driving unit 34b. The current sensor 34a is coupled to the CPU 36 from a point between the source terminal of the FET Q4 and the current detection resistance R2. The FET Q4 is turned on/off by the driving unit 34b. The FET Q4 passes a determined ratio of a current relative to the current flowing into the FET Q2 as a current flowing from the drain terminal side of the FET Q2 into the current detection resistance R2 when turned on by the driving unit 34b, and blocks the current flowing from the drain terminal side of the FET Q2 into the current detection resistance R2 when turned off by the driving unit 34b. The current sensor 34a inputs, to the CPU 36, a voltage determined by the current flowing from the FET Q4 into the current detection resistance R2 and the current detection resistance R2 as a detected value of the current value.

The driving unit 34b drives the FETs Q2 and Q4. The driving unit 34b is coupled to the CPU 36, and the CPU 36 outputs a command signal for turning on or off the FETs Q2 and Q4 to this unit. The driving unit 34b turns on the FETs Q2 and Q4 when an on command signal is output from the CPU 36, and turns off the FETs Q2 and Q4 when an off command signal is output from the CPU 36.

The junction 35 is provided at a point between the FET Q1 and the FET Q2. The junction 35 is provided on the connecting wire Lf, which couples the drain terminal of the FET Q1 to the drain terminal of the FET Q2. The load unit 2 is coupled to the junction 35.

The CPU 36 controls the FETs Q1 to Q4. The CPU 36 outputs, to the driving unit 33b, the command signal for turning on or off the FETs Q1 and Q3 based on the current output from the current sensor 33a. The CPU 36 outputs, to the driving unit 34b, the command signal for turning on or off the FETs Q2 and Q4 based on the current output from the current sensor 34a.

Specifically, the CPU 36 detects the amperage of the current flowing into the FET Q1 based on the current output from the current sensor 33a. The CPU 36 compares, for example, the output current output from the current sensor 33a with a predetermined threshold, and determines that an overcurrent flows into the FET Q1 when the output current is greater than or equal to the threshold. Furthermore, the CPU 36 detects the first current direction, which is the direction of the current flowing into the FET Q1, based on the output current output from the current sensor 33a. For example, when a current flows in the direction from the drain terminal to the source terminal of the FET Q1, an output voltage from the current sensor 33a is positive and the CPU 36 determines that the current direction is a positive direction. When a current flows in the direction from the source terminal to the drain terminal of the FET Q1, the output from the current sensor 33a to the CPU 36 is 0 V. In this case, the CPU 36 determines whether the current flows toward a negative direction or whether the passed current is 0 A, in conjunction with current information of the adjacent switch unit 30.

Similarly, the CPU 36 detects the amperage of the current flowing into the FET Q2 based on the current output from the current sensor 34a. The CPU 36 compares, for example, the output current output from the current sensor 34a with a predetermined threshold, and determines that an overcurrent flows into the FET Q2 when the output current is greater than or equal to the threshold. Furthermore, the CPU 36 detects the second current direction, which is the direction of the current flowing into the FET Q2, based on the output current output from the current sensor 34a. For example, when a current flows in the direction from the drain terminal to the source terminal of the FET Q2, an output voltage from the current sensor 34a is positive and the CPU 36 determines that the current direction is a positive direction. When a current flows in the direction from the source terminal to the drain terminal of the FET Q2, the CPU 36 knows that the output from the current sensor 34a is 0 V. In this case, the CPU 36 determines whether the current flows toward the negative direction or whether the passed current is 0 A, in conjunction with current information of the adjacent switch unit 30.

The CPU36 turns off the own FET Q1 based on the amperage and the first current direction of the FET Q1 (FET Q1 to be controlled) of the own switch unit 30 as well as the second current direction of the FET Q2 (FET Q2 to be uncontrolled) of another switch unit 30. That is, the CPU 36 turns off the FET Q1 to be controlled based on the amperage of the FET Q1 to be controlled, the first current direction of the FET Q1 to be controlled, and the second current direction of the FET Q2 to be uncontrolled. Here, the FET Q1 to be controlled is the FET Q1 that is included in the same switch unit 30 as a certain CPU 36 and is a target controlled by the CPU36. The FET Q2 to be uncontrolled is the FET Q2 that is included in the switch unit 30 different from a certain CPU 36 (for example, the adjacent switch unit 30) and is not a target controlled by the CPU36. For example, between adjacent switch units 30, when an overcurrent flows into the FET Q1 to be controlled and the first current direction of the FET Q1 to be controlled and the second current direction of the FET Q2 to be uncontrolled are different, the CPU36 determines that a short circuit has occurred and turns off the FET Q1 to be controlled.

Similarly, the CPU36 turns off the own FET Q2 based on the amperage and the second current direction of the FET Q2 (FET Q2 to be controlled) of the own switch unit 30 as well as the first current direction of the FET Q1 (FET Q1 to be uncontrolled) of another switch unit 30. That is, the CPU36 turns off the FET Q2 to be controlled based on the amperage of the FET Q2 to be controlled, the second current direction of the FET Q2 to be controlled, and the first current direction of the FET Q1 to be uncontrolled. For example, between adjacent switch units 30, when an overcurrent flows into the FET Q2 to be controlled and the second current direction of the FET Q2 to be controlled and the first current direction of the FET Q1 to be uncontrolled are different, the CPU 36 determines that a short circuit has occurred and turns off the FET Q2 to be controlled.

Figure 3:
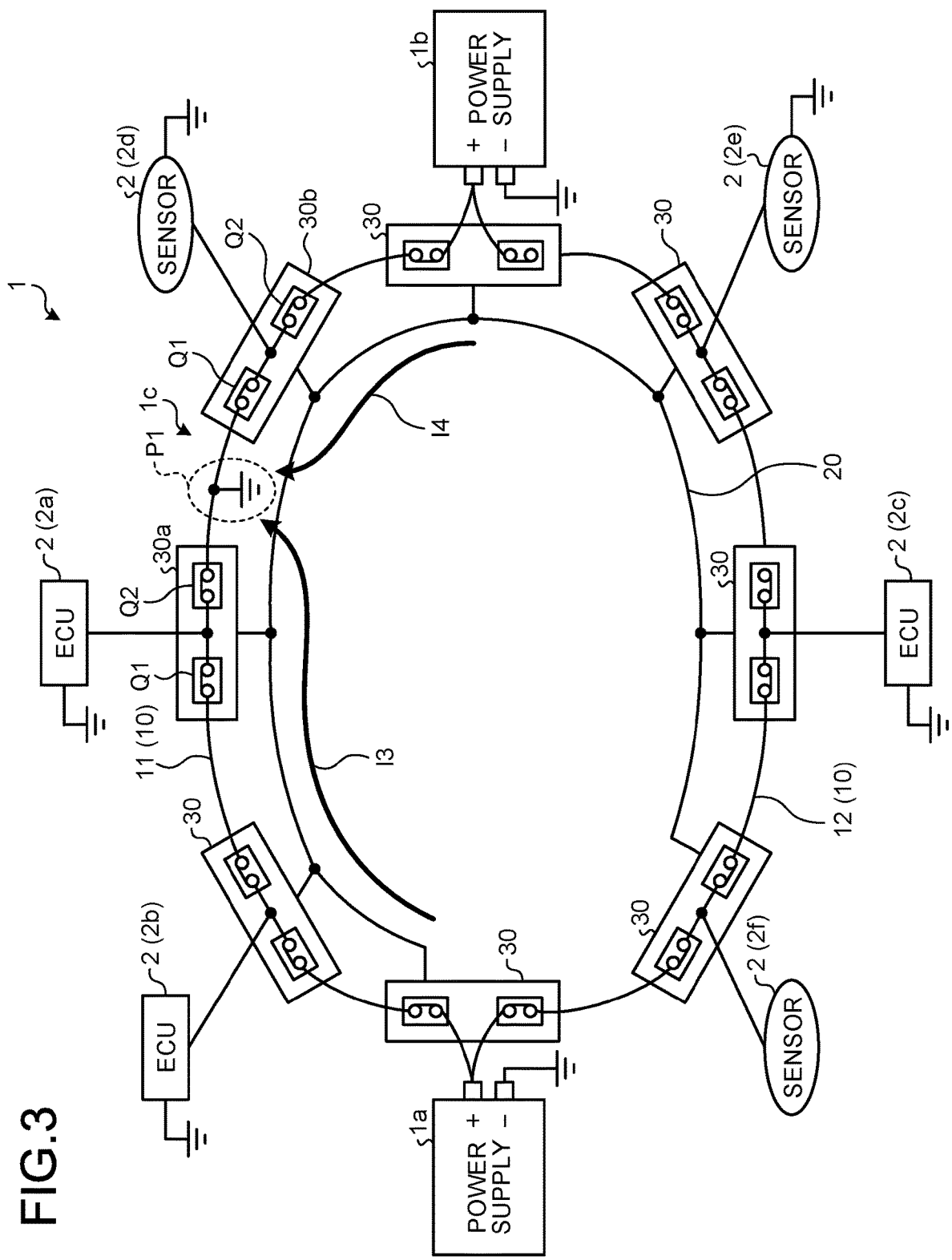
FIG. 3 is a schematic diagram illustrating an example of a short circuit in the power-supply device according to the embodiment.
Figure 4:
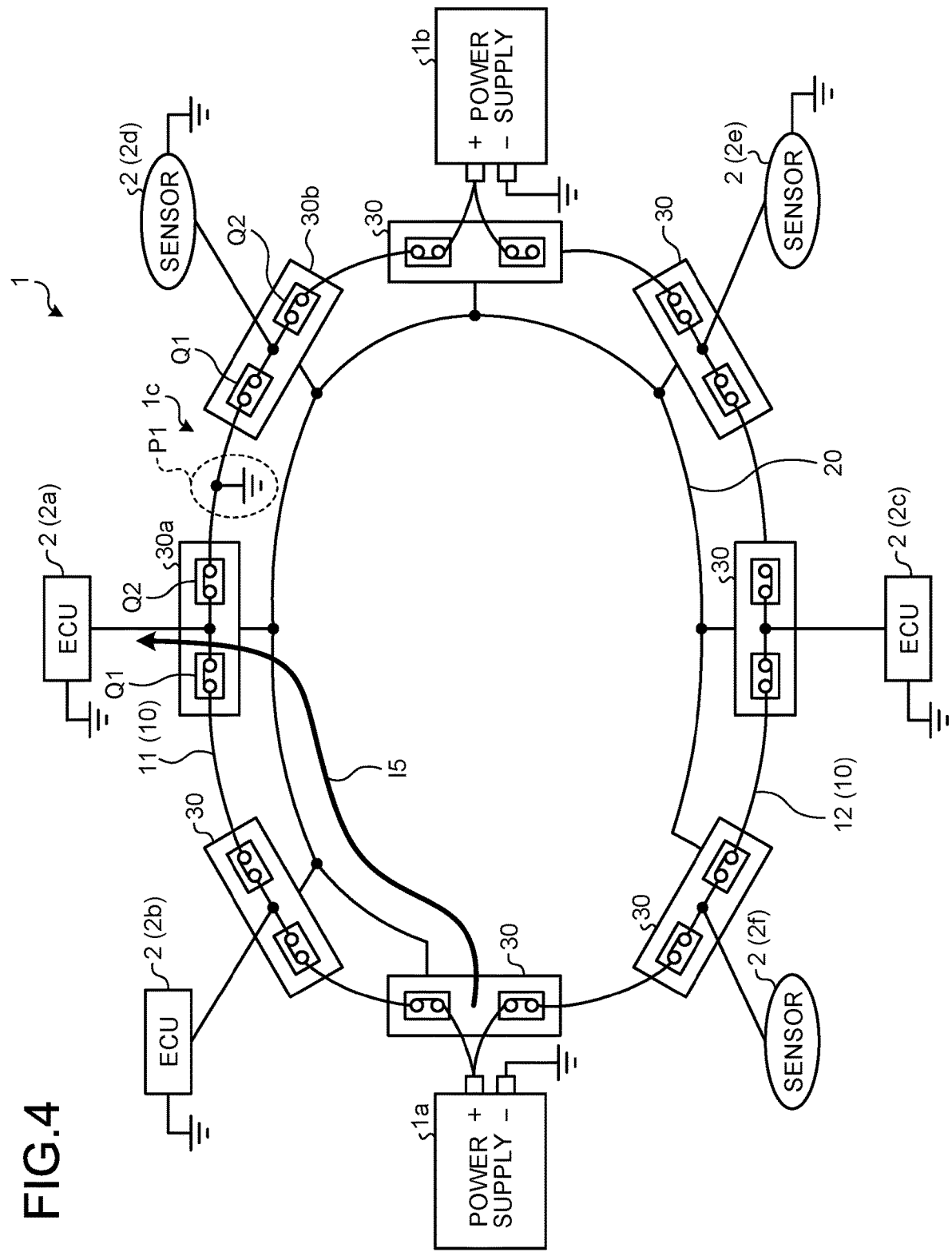
FIG. 4 is a schematic diagram illustrating a first operation example during the short circuit in the power-supply circuit according to the embodiment.
Figure 5:
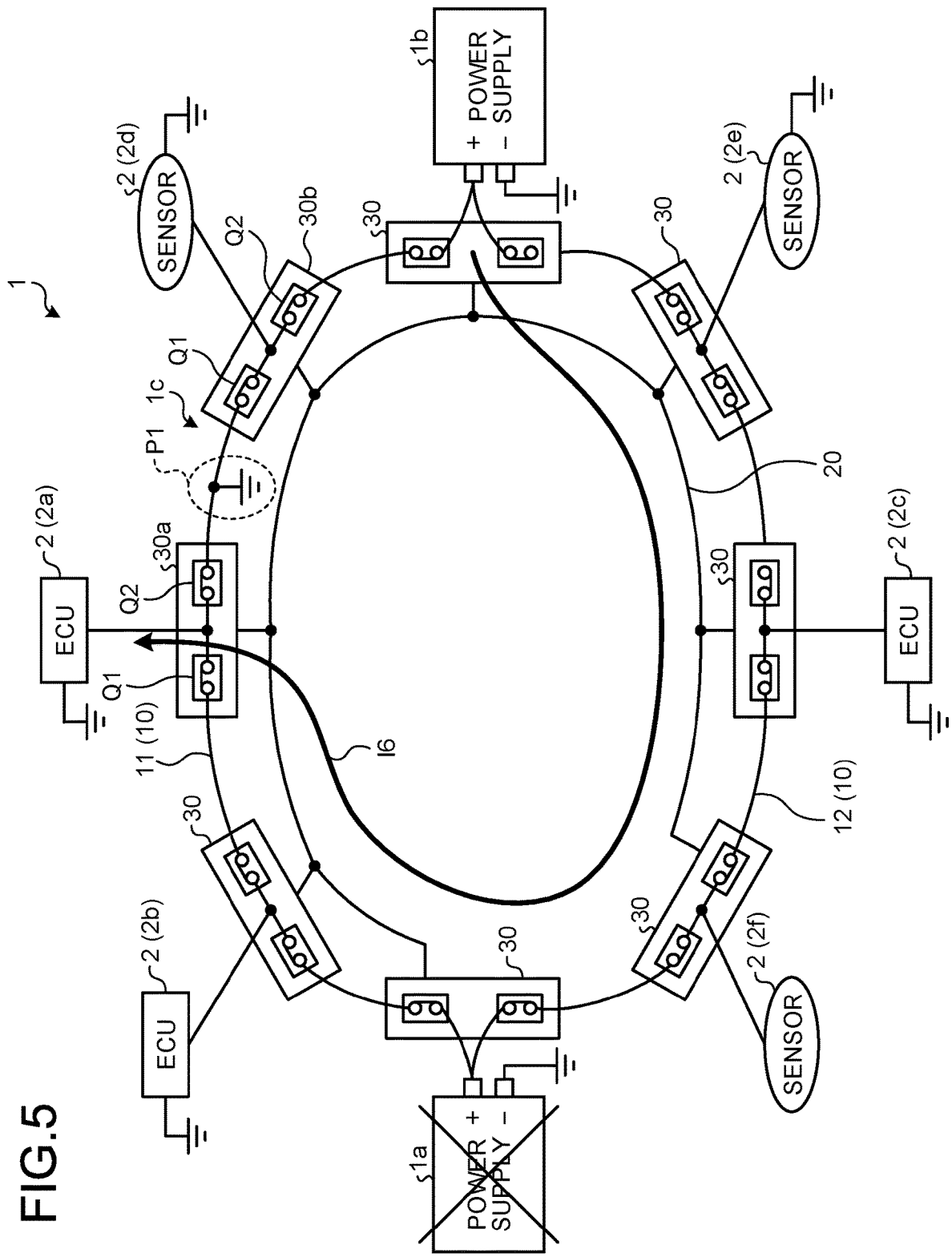
FIG. 5 is a schematic diagram illustrating a second operation example during the short circuit in the power-supply device according to the embodiment.

An operation example of the power-supply device 1 will now be described. For easy understanding of the description, an example in which the power supply 1a or the power supply 1b supplies power to an ECU 2a is described. FIG. 3 is a schematic diagram illustrating an example of a short circuit in the power-supply circuit 1c according to the embodiment. FIG. 4 is a schematic diagram illustrating a first operation example during the short circuit in the power-supply circuit 1c according to the embodiment. FIG. 5 is a schematic diagram illustrating a second operation example during the short circuit in the power-supply circuit 1c according to the embodiment.

For example, when the power-supply circuit 1c is normal, the power-supply device 1 supplies power from the power supply 1a to the ECU 2a via the current path I1 or supplies power from the power supply 1b to the ECU 2a via the current path I2, as illustrated in FIG. 1. For example, in the power-supply device 1, when a short circuit in the power-supply circuit 1c occurs at a point P1, short-circuit currents I3 and I4 flow toward the point P1, as illustrated in FIG. 3. At this time, a switch unit 30a detects an overcurrent and detects the current direction different from that of the adjacent switch unit 30b, thereby keeping the own FET Q1 on and turning off the own FET Q2. This enables the switch unit 30a to block the short-circuit current I3. The switch unit 30b detects an overcurrent and detects the current direction different from that of the adjacent switch unit 30a, thereby turning off the own FET Q1 and keeping the own FET Q2 on. This enables the switch unit 30b to block the short-circuit current I4. The switch units 30 other than the switch units 30a and 30b keep their FETs Q1 and Q2 on. As illustrated in FIG. 4, this enables the power-supply device 1 to electrically isolate the point P1, which is a short-circuited point, from the power-supply circuit 1c and supply power from the power supply 1a to the ECU 2a via a current path I5. Note that, for example, when the short circuit in the power-supply circuit 1c occurs at the point P1 and the power supply 1a has a failure, the power-supply device 1 supplies power from the power supply 1b to the ECU 2a via a current path I6, as illustrated in FIG. 5.

Figure 6:
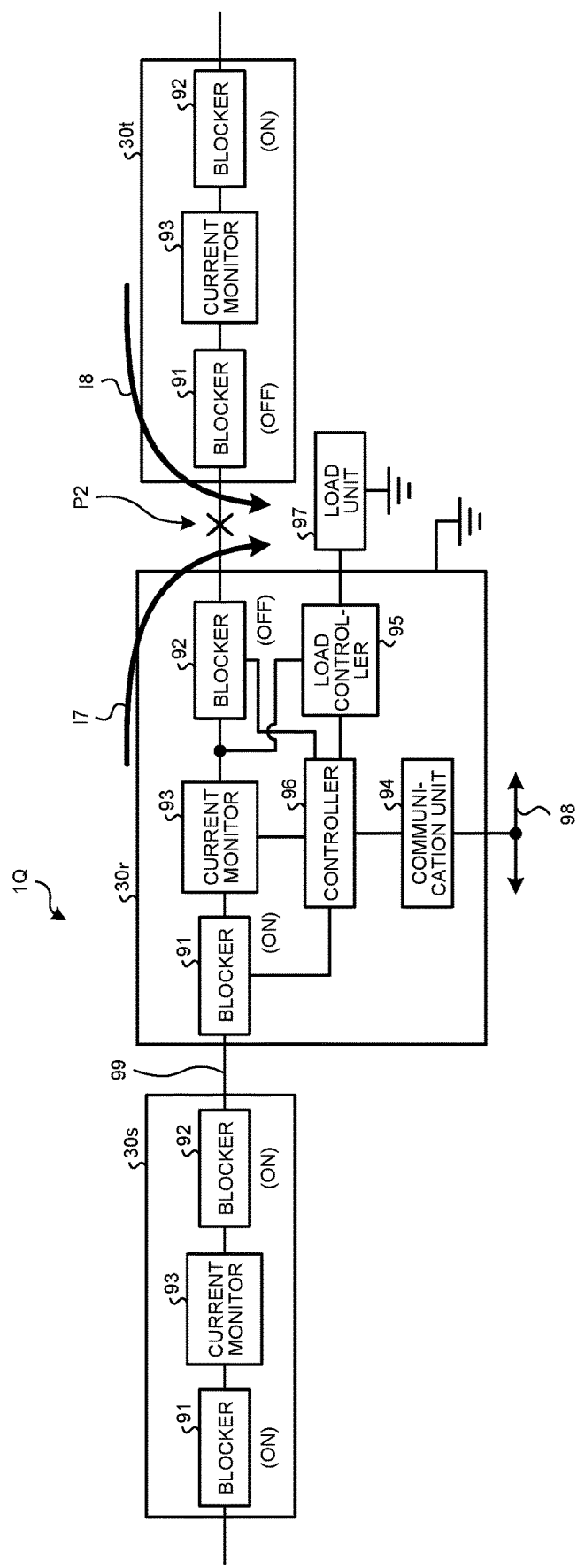
FIG. 6 is a block diagram illustrating a first operation example during a short circuit in a switch unit according to a comparative example.
Figure 7:
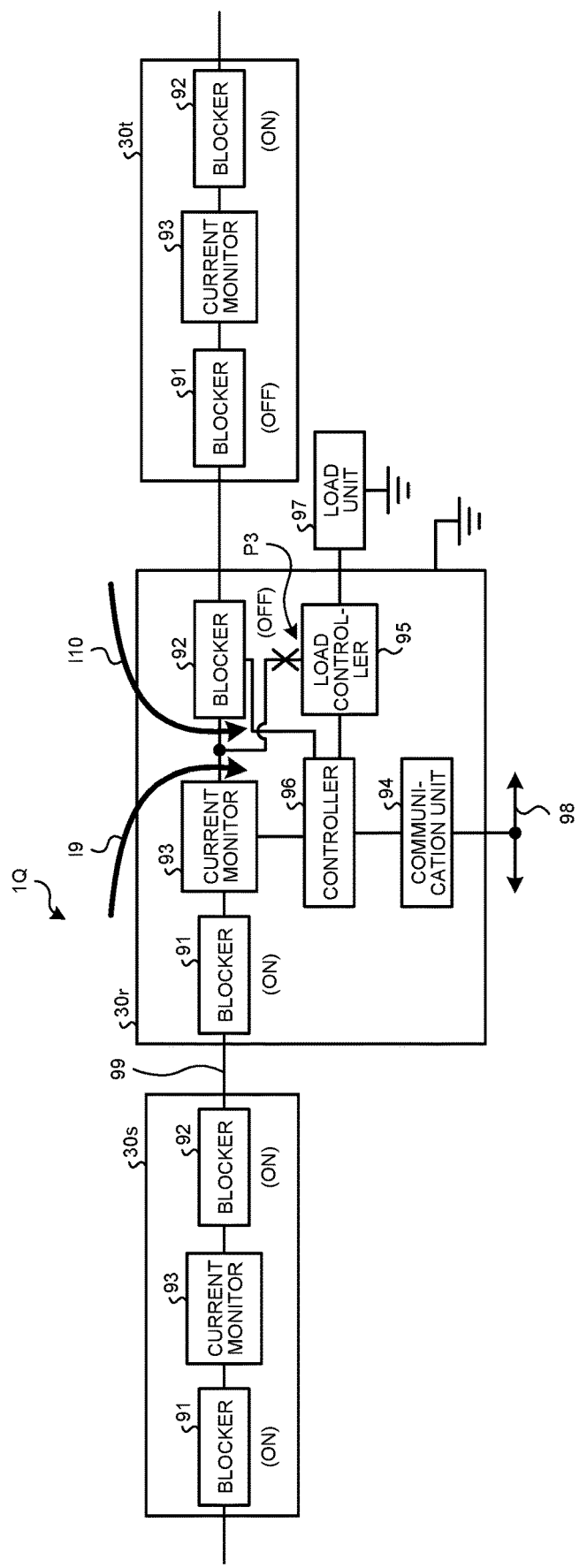
FIG. 7 is a block diagram illustrating a second operation example during a short circuit of the switch unit according to the comparative example.
Figure 8:
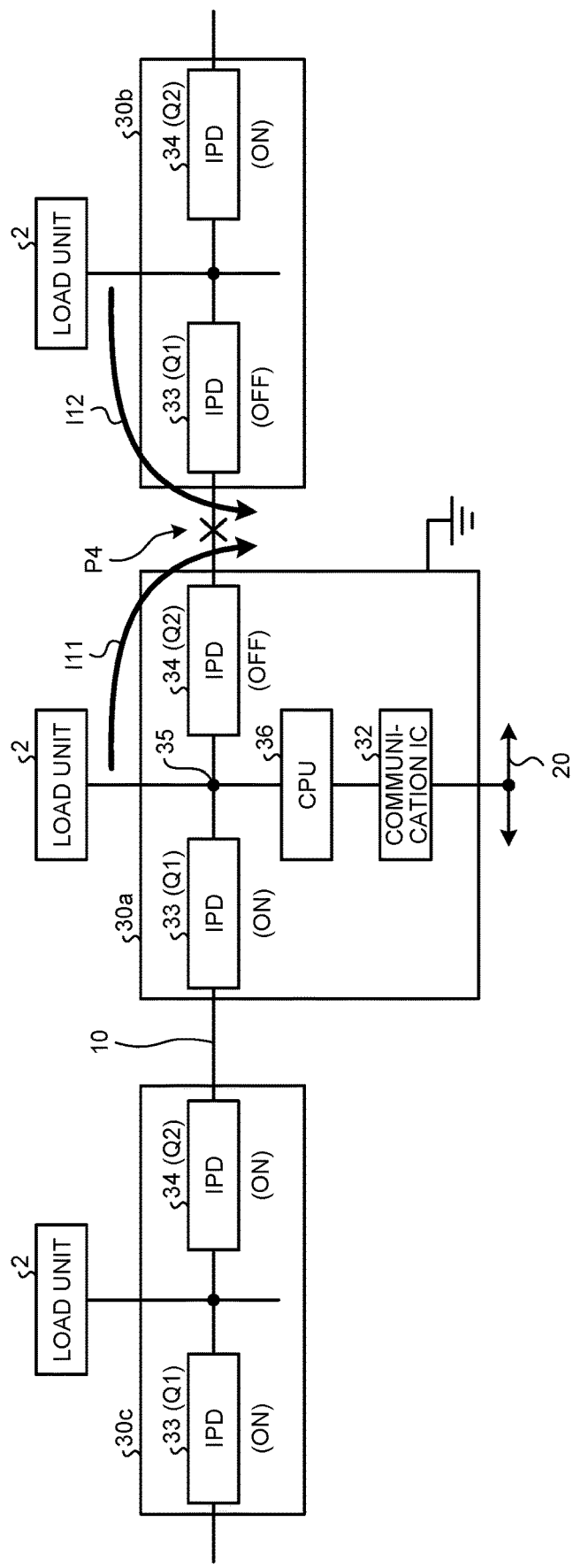
FIG. 8 is a block diagram illustrating a first operation example during a short-circuit of the switch unit according to the embodiment.
Figure 9:
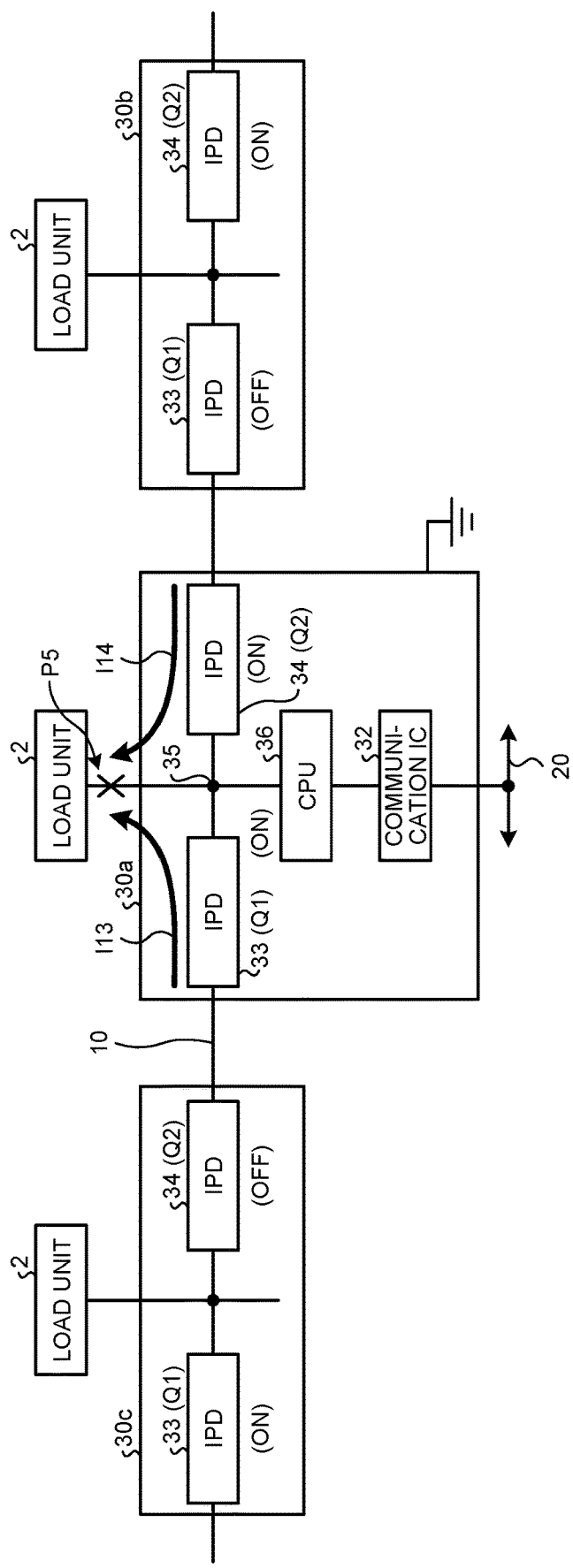
FIG. 9 is a block diagram illustrating a second operation example during a short circuit of the switch unit according to the embodiment.

An operation of the power-supply device 1 according to the embodiment will now be described in detail with reference to a comparative example. FIG. 6 is a block diagram illustrating a first operation example during a short circuit in a switch unit 30r and other switch units according to the comparative example. FIG. 7 is a block diagram illustrating a second operation example during a short circuit of the switch unit 30r and other switch units according to the comparative example. FIG. 8 is a block diagram illustrating a first operation example during a short circuit in the switch unit 30a and other switch units according to the embodiment. FIG. 9 is a block diagram illustrating a second operation example during a short circuit in the switch unit 30a and other switch units according to the embodiment.

The switch unit 30r includes a blocker 91, a blocker 92, a current monitor 93, a communication unit 94, a load controller 95, and a controller 96. The blocker 91 and the blocker 92 pass or block a current flowing into an electric-wire unit 99. The current monitor 93 monitors the amperage and current direction of the current flowing through the electric-wire unit 99. The communication unit 94 communicates via a communication wire 98. The load controller 95 controls a load unit 97. The controller 96 controls the blockers 91 and 92 based on the result of the current monitor 93.

In a power-supply device 1Q according to the comparative example, when a short circuit occurs at a point P2 located between the switch unit 30r and the switch unit 30t, short-circuit currents I7 and I8 flow toward the point P2, as illustrated in FIG. 6. At this time, the switch unit 30r detects an overcurrent by using the current monitor 93 and detects the current direction different from that of the adjacent switch unit 30t, thereby keeping the own blocker 91 on and turning off the own blocker 92. The switch unit 30t detects an overcurrent by using the current monitor 93 and detects a current direction different from that of the adjacent switch unit 30r, thereby turning off the own blocker 91 and keeping the own blocker 92 on. This enables the power-supply device 1Q to electrically isolate the point P2, which is a short-circuited point, from the power-supply circuit and supply power to the load unit 97.

In the power-supply device 1Q according to the comparative example, when a short circuit occurs at a point P3 located between the load controller 95 and the junction of the current monitor 93 and the blocker 92, short-circuit currents I9 and I10 flow toward the point P3, as illustrated in FIG. 7. At this time, the switch unit 30r detects an overcurrent by using the current monitor 93 and detects a current direction different from that of the adjacent switch unit 30t, thereby keeping the own blocker 91 on and turning off the own blocker 92. In this case, the short-circuit current I9 continue to flow even if the blocker 92 is turned off, and the switch unit 30r thus may fail to electrically isolate the point P3, which is a short-circuited point, from the power-supply circuit. Furthermore, no power is supplied to the switch unit 30r when the blockers 91 and 92 are turned off, and the switch unit 30r thus becomes inoperable even when the switch unit 30r is normal.

In contrast, in the power-supply device 1 according to the embodiment, when a short circuit occurs at a point P4 located between the switch unit 30a and the switch unit 30b, short-circuit currents I11 and I12 flow toward the point P4, as illustrated in FIG. 8. At this time, the switch unit 30a detects an overcurrent and detects a current direction (second current direction to be controlled) different from the current direction of the adjacent switch unit 30b (first current direction to be uncontrolled), thereby keeping the FET Q1 of the own IPD 33 on and turning off the FET Q2 of the own IPD 34. Furthermore, the switch unit 30b detects an overcurrent and detects a current direction (first current direction to be controlled) different from the current direction of the adjacent switch unit 30a (second current direction to be uncontrolled), thereby turning off the FET Q1 of the own IPD 33 and keeping the FET Q2 of the own IPD 34 on.

Unlike the aforementioned case, the current directions of the switch units 30 other than the switch units 30a and 30b are equal between adjacent switch units 30, so that these units keep their FETs Q1 and Q2 on. This enables the power-supply device 1 to electrically isolate the point P4, which is a short-circuited point, from the power-supply circuit 1c and supply power from the power supplies 1a and 1b to the load unit 2.

In the power-supply device 1 according to the embodiment, when a short circuit occurs at a point P5 located between the load unit 2 and the junction 35 of the IPD 33 and the IPD 34, short-circuit currents I13 and I14 flow toward the point P5, as illustrated in FIG. 9. At this time, the switch unit 30a keeps the own FET Q1 on. This is because the direction of a current flowing into the own FET Q1 (first current direction to be controlled) and the direction of a current flowing into the FET Q2 of the adjacent switch unit 30c (second current direction to be uncontrolled) are the same direction. Furthermore, the switch unit 30a keeps the own FET Q2 on. This is because the direction of a current flowing into the own FET Q2 (second current direction to be controlled) and the direction of the current flowing into the FET Q1 of the adjacent switch unit 30b (first current direction to be uncontrolled) are the same direction.

The switch unit 30b turns off own FET Q1. This is because the direction of the current flowing into the own FET Q1 (first current direction to be controlled) and the direction the current flowing into the FET Q2 of the adjacent switch unit 30a (the second current direction to be uncontrolled) are the same direction, while the direction of the current flowing into the own FET Q1 (first current direction to be controlled) and the direction of a current flowing into the FET Q2 of the switch unit 30c adjacent to the adjacent one (two units away) (second current direction to be uncontrolled) are different.

Similarly, the switch unit 30c turns off the own FET Q2. This is because the direction the current flowing into the own FET Q2 (second current direction to be controlled) and the direction of the current flowing into the FET Q1 of the adjacent switch unit 30a (first current direction to be uncontrolled) are the same direction, while the direction of the current flowing into the own FET Q2 (second current direction to be controlled) and the direction of the current flowing into the FET Q1 of the switch unit 30b adjacent to the adjacent one (two units away) (first current direction to be uncontrolled) are different. In this way, each switch unit 30 turns off the own FETs Q1 and Q2 based on the directions of the currents into the own FETs Q1 and Q2 as well as the directions of the currents into the FETs Q1 and Q2 of the adjacent switch unit 30. Even if the short circuit occurs at the point P5 located between the load unit 2 and the junction 35 of the IPD 33 and the IPD 34, this enables the power-supply device 1 to electrically isolate the short-circuited point P5 from the power-supply circuit 1c and supply power from the power supplies 1a and 1b to other load units 2.

The power-supply device 1Q according to the comparative example supplies, via the switch unit 30r and other switch units, power to the load unit 97 that consumes high power, so that installing the multiple switch units 30r, 30s, 30t, and other switch units result in an increased current flowing into the electric-wire unit 99. Thus, the electric-wire unit 99 of the power-supply device 1Q must be thickened in order that the blockers 91 and 92 can support a large current.

In contrast, the power-supply device 1 according to the embodiment supplies, via the switch unit 30, power to the load unit 2 that consumes low power, such as an ECU or a sensor, so that a current flowing into the electric wire unit 10 can be lower than that of the power-supply device 1Q according to the comparative example. In the power-supply device 1 according to the embodiment, this enables an electric-wire unit of the electric-wire unit 10 to be thin and enables devices that support such a low current to be used as the IPDs 33 and 34, thereby preventing an increase in an installing space and an increase in a production cost.

The power-supply device 1Q according to the comparative example may fail to supply power to the controller 96 when the blockers 91 and 92 are off. In contrast, the power-supply device 1 according to the embodiment has the body diode D1 of the FET Q1 and the body diode D2 of the FET Q2, which are disposed in a direction where the CPU 36 is energized, and thus supplies, whether the FETs Q1 and Q2 are on or off, power to the CPU 36 when the switch unit 30 is coupled to the power supplies 1a and 1b.

As above, the power-supply device 1 according to the embodiment includes the power supplies 1a and 1b, the power-supply circuit 1c, and the CPU 36. The power supplies 1a and 1b supply power. The power-supply circuit 1c is coupled to the power supplies 1a and 1b, and includes the switch units 30. The switch units 30 pass or block a current of the power supplied from the power supplies 1a and 1b. The CPU 36 controls turning on/off the switches SW1 and SW2 of the switch unit 30 and controls the power-supply circuit 1c. The switch units 30 include the switch SW1, the switch SW2, and the junction 35. The switch SW1 has the FET Q1 and the current sensor 33a. The FET Q1 passes or blocks a current flowing from one side in the power-supply circuit 1c. The current sensor 33a detects a current flowing into the FET Q1. The switch SW2 has the FET Q2 and the current sensor 34a. The FET Q2 is coupled to the FET Q1, and passes or blocks a current flowing from another side in the power-supply circuit 1c. The current sensor 34a detects a current flowing into the FET Q2. The junction 35 couples the load unit 2 at a point between the FET Q1 and the FET Q2. In each of the switch units 30, the CPU 36 controls the corresponding switch unit 30 of the power-supply circuit 1c based on the detection result detected by the corresponding current sensors 33a and 34a.

When a short circuit occurs in the power-supply circuit 1c, this configuration enables the power-supply device 1 to block the SW1 and SW2 of the switch unit 30 associated with the short-circuit point and energize the SW1 and SW2 of the other switch units 30. When a short circuit occurs in the power-supply circuit 1c, this enables the power-supply device 1 to electrically isolates the short-circuit point from the power-supply circuit 1c to close a circuit other than the short-circuit point and supply power to each load unit 2 coupled to the closed circuit. This improves the fault tolerance of the power-supply device 1.

In the power-supply device 1, the switch unit 30 to be controlled includes the communication IC 32 that can communicate with the switch unit 30 to be uncontrolled. The current sensor 33a to be controlled detects the amperage of the current flowing into the FET Q1 to be controlled and the first current direction to be controlled, which is the direction of the current flowing into the FET Q1 to be controlled. The current sensor 34a to be controlled detects the amperage of the current flowing into the FET Q2 to be controlled and the second current direction to be controlled, which is the direction of the current flowing into the FET Q2 to be controlled. The communication IC 32 to be controlled receives the first current direction to be uncontrolled, which is the direction of the current flowing into the FET Q1 to be uncontrolled of the switch unit 30 to be uncontrolled and the second current direction to be uncontrolled, which is the direction of the current flowing into the FET Q2 to be uncontrolled of the switch unit 30 to be uncontrolled. The CPU 36 controls turning on/off the FET Q1 to be controlled based on the amperage of the FET Q1 to be controlled, the first current direction to be controlled, and the second current direction to be uncontrolled, and controls turning on/off the FET Q2 to be controlled based on the amperage of the FET Q2 to be controlled, the second current direction to be controlled, and the first current direction to be uncontrolled. This configuration enables the power-supply device 1 to determine a short circuit based on the directions where the currents flows and their amperages, turn off the FETs Q1 and Q2 based on the determination results, and block a current flowing into the short-circuit point in the power-supply circuit 1c.

When an overcurrent flows into the FET Q1 to be controlled and the second current direction of the FET Q2 to be uncontrolled that is different from the first current direction of the FET Q1 to be controlled is included, the CPU36 of the power-supply device 1 turns off the FET Q1 to be controlled. When an overcurrent flows into the FET Q2 to be controlled and the first current direction of the FET Q1 to be uncontrolled that is different from the second current direction of the FET Q2 to be controlled is included, the CPU36 turns off the FET Q2 to be controlled. If the current directions are different when an overcurrent flows, this configuration enables the power-supply device 1 to turn off the FETs Q1 and Q2 to be controlled and block a current flowing into the short-circuit point in the power-supply circuit 1c.

Modification

Figure 10:
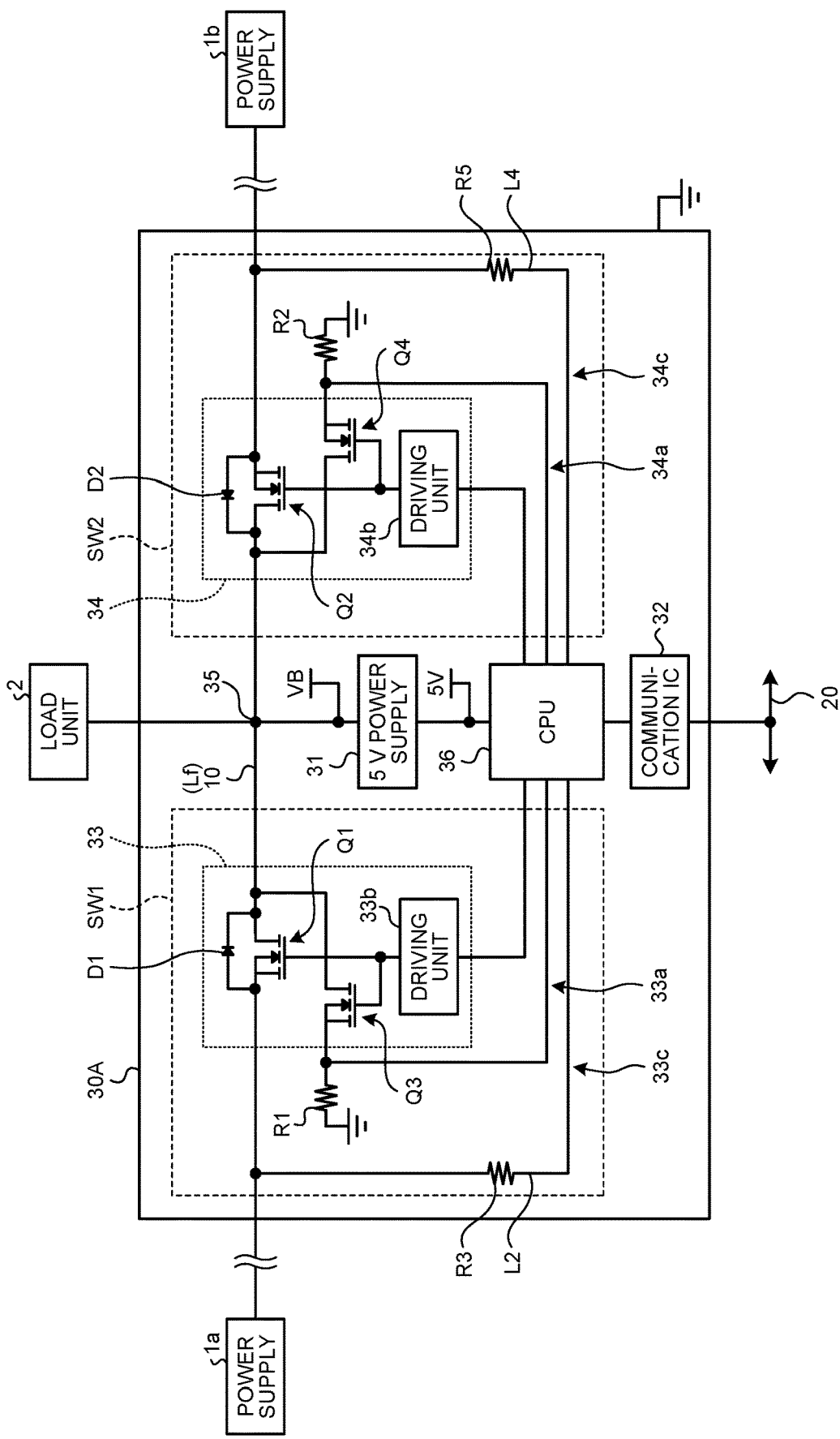
FIG. 10 is a circuit diagram illustrating a configuration example of a switch unit according to a first modification of the embodiment.

Modifications of the Embodiment will now be described. FIG. 10 is a circuit diagram illustrating a configuration example of a switch unit 30A according to a first modification of the embodiment. Note that, in the following modifications, the same number is referred to the components equal to those of the embodiment and the detailed description is omitted. The switch unit 30A is different from the switch unit 30 according to the embodiment in that this unit includes a short-circuit detector. As illustrated in FIG. 10, the switch unit 30A includes the 5 V power supply 31, the switch SW1, the switch SW2, the junction 35, and the CPU36. The switch SW1 has the IPD 33 and a first short-circuit detector 33c. The switch SW2 has the IPD 34 and a second short-circuit detector 34a.

The first short-circuit detector 33c detects a short circuit in the power-supply circuit 1c. The first short-circuit detector 33c includes an electric wire L2, through which power is supplied from the source terminal side of the FET Q1 via a resistance R3. The electric wire L2 is coupled to the CPU 36. When no short circuit occurs on the source terminal side of the FET Q1, the first short-circuit detector 33c outputs a voltage equal to the power-supply voltage VB to the CPU 36. In contrast, when a short circuit occurs on the source terminal side of the FET Q1, the first short-circuit detector 33c outputs a voltage equal to 0 V to the CPU 36. The CPU 36 determines a short circuit based on the voltage output from the first short-circuit detector 33c to be controlled. For example, the CPU 36 determines that no short circuit occurs, when the first short-circuit detector 33c to be controlled outputs the voltage equal to the power-supply voltage VB. The CPU 36 determines that a short circuit occurs on the source terminal side of the FET Q1 to be controlled, when the first short-circuit detector 33c to be controlled outputs the voltage equal to 0 V.

The CPU 36 turns off the FET Q1 to be controlled based on the short-circuit result detected by the first short-circuit detector 33c to be controlled and the amperage detected by the current sensor 33a to be controlled. For example, the CPU 36 turns off the FET Q1 to be controlled when an overcurrent is detected by the current sensor 33a to be controlled and a short circuit is detected by the first short-circuit detector 33c to be controlled. In contrast, the CPU 36 does not turn off the FET Q1 to be controlled when no overcurrent is detected by the current sensor 33a to be controlled or no short circuit is detected by the first short-circuit detector 33c to be controlled.

Similarly, the second short-circuit detector 34c detects a short circuit in the power-supply circuit 1c. The second short-circuit detector 34c includes an electric wire L4, through which power is supplied from the source terminal side of the FET Q2 via a resistance R5. The electric wire L4 is coupled to the CPU 36. When no short circuit occurs on the source terminal side of the FET Q2, the second short-circuit detector 34c outputs a voltage equal to the power-supply voltage VB to the CPU 36. When a short circuit occurs on the source terminal side of the FET Q1, the second short-circuit detector 34c outputs a voltage equal to 0 V to the CPU 36. The CPU 36 determines a short circuit based on the voltage output from the second short-circuit detector 34c to be controlled. For example, the CPU 36 determines that no short circuit occurs, when the second short-circuit detector 34c to be controlled outputs the voltage equal to the power-supply voltage VB. The CPU 36 determines that a short circuit occurs, when the second short-circuit detector 34c to be controlled outputs the voltage equal to 0 V.

The CPU 36 turns off the FET Q2 based on the short-circuit result detected by the second short-circuit detector 34c to be controlled and the amperage detected by the current sensor 34a to be controlled. For example, the CPU 36 turns off the FET Q2 to be controlled when an overcurrent is detected by the current sensor 34a to be controlled and a short circuit is detected by the second short-circuit detector 34c to be controlled. The CPU 36 does not turn off the FET Q2 to be controlled when no overcurrent is detected by the current sensor 34a to be controlled or no short circuit is detected by the second short-circuit detector 34c to be controlled.

As above, in the switch unit 30A according to the first modification of the embodiment, the switch SW1 to be controlled has the first short-circuit detector 33c to be controlled, which detects a short circuit in the power-supply circuit 1c. The switch SW2 to be controlled has the second short-circuit detector 34c to be controlled, which detects a short circuit in the power-supply circuit 1c. The current sensor 33a to be controlled detects the current flowing into the FET Q1 to be controlled. The current sensor 34a to be controlled detects the amperage of the current flowing into the FET Q2 to be controlled. The CPU 36 turns off the FET Q1 to be controlled based on the amperage detected by the current sensor 33a to be controlled and the short-circuit result detected by the first short-circuit detector 33c to be controlled, and turns off the FET Q2 to be controlled based on the amperage detected by the current sensor 34a to be controlled and the short-circuit result detected by the second short-circuit detector 34c to be controlled. If the switch unit 30A detects a short circuit when an overcurrent flows, this configuration enables this switch unit to turn off the FETs Q1 and Q2 to be controlled and block a current flowing into the short-circuit point in the power-supply circuit 1c.

Figure 11:
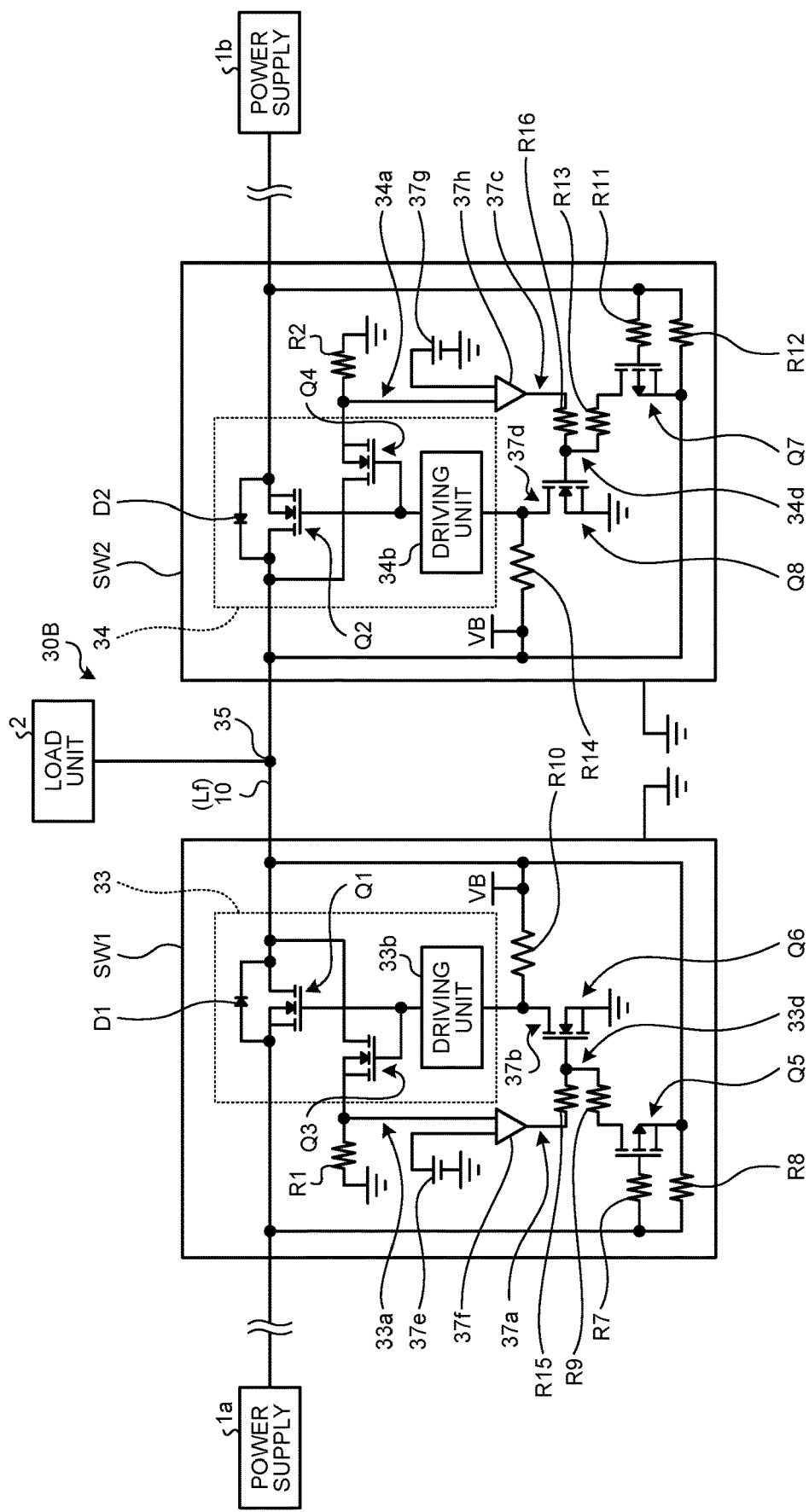
FIG. 11 is a circuit diagram illustrating a configuration example of a switch unit according to a second modification of the embodiment.

A switch unit 30B according to a second modification of the embodiment will now be described. FIG. 11 is a circuit diagram illustrating a configuration example of the switch unit 30B according to the second modification of the embodiment. The switch unit 30B is different from the switch unit 30 according to the embodiment in that this unit includes a short-circuit detector. As illustrated in FIG. 11, the switch unit 30B includes the switch SW1, the switch SW2, and the junction 35. The switch SW1 has the IPD 33, a first current-determining unit 37a, a first short-circuit detector 33d, and an IPD controller 37b. The switch SW2 has the IPD 34, a second current-determining unit 37c, a second short-circuit detector 34d, and an IPD controller 37d.

The first current-determining unit 37a of the switch SW1 determines an overcurrent. The first current-determining determining unit 37a has a power supply 37e and a comparator 37f. The power supply 37e applies a constant voltage. The power supply 37e is coupled to a first input terminal of the comparator 37f and applies the constant voltage to the first input terminal. The current sensor 33a is coupled to a second input terminal of the comparator 37f and outputs the voltage corresponding to an output current to the second input terminal. The output terminal of the comparator 37f is coupled to the gate terminal of a FET Q6 via a resistance R15. The comparator 37f compares the voltage corresponding to the output current output from the current sensor 33a with the applied voltage applied by the power supply 37e. When the voltage corresponding to the output current is greater than or equal to the applied voltage, the comparator 37f determines that an overcurrent flows into the FET Q1 and turns on the FET Q6 of the IPD controller 37b to turn off the FET Q1. In contrast, when the voltage corresponding to the output current is less than the applied voltage, the comparator 37f determines that no overcurrent flows into the FET Q1, and turns off the FET Q6 of the IPD controller 37b to turn on the FET Q1.

The first short-circuit detector 33d detects a short circuit in the power-supply circuit 1c. The first short-circuit detector 33d has a FET Q5. The FET Q5 is a P-channel-type MOSFET. The drain terminal of the FET Q5 is coupled to the gate terminal of the FET Q6 via a resistance R9. The source terminal of the FET Q5 is coupled to the drain terminal of the FET Q1 and coupled to the source terminal of the FET Q1 via a resistance R8. The gate terminal of the FET Q5 is coupled to the source terminal of the FET Q1 via a resistance R7. When a short circuit occurs on the source terminal side of the FET Q1, the first short-circuit detector 33d turns on the FET Q5. This causes the first short-circuit detector 33d to turn on the FET Q6 of the IPD controller 37b to turn off the FET Q1. When no short circuit occurs on the source terminal side of the FET Q1, the first short-circuit detector 33d turns off the FET Q5. This causes the first short-circuit detector 33d to turn off the FET Q6 of the IPD controller 37b to turn on the FET Q1.

The IPD controller 37b controls the FET Q1. The IPD controller 37b has the FET Q6. The FET Q6 is an N-channel-type MOSFET. The drain terminal of the FET Q6 is coupled to the IPD 33. The source terminal of the FET Q6 is coupled to the ground. The gate terminal of the FET Q6 is coupled to the first current-determining unit 37a and the first short-circuit detector 33d. Specifically, the drain terminal of the FET Q6 is coupled to the driving unit 33b. The gate terminal of the FET Q6 is coupled to the output terminal of the comparator 37f and the drain terminal of the FET Q5. The junction at a point between the drain terminal of the FET Q6 and the driving unit 33b is coupled to the connecting wire Lf via a resistance R10.

When the first current-determining unit 37a to be controlled detects an overcurrent, the IPD controller 37b turns off the FET Q1 to be controlled by turning on the FET Q6 and blocks a current flowing into this FET Q1 to be controlled. In contrast, when the first current-determining unit 37a to be controlled detects no overcurrent, the IPD controller 37b turns on the FET Q1 to be controlled by turning off the FET Q6 and does not block the current flowing into this FET Q1 to be controlled. When the first short-circuit detector 33d to be controlled detects a short circuit, the IPD controller 37b turns off the FET Q1 to be controlled by turning on the FET Q6 and blocks the current flowing into this FET Q1 to be controlled. When the first short-circuit detector 33d to be controlled detects no short circuit, the IPD controller 37b turns on the FET Q1 to be controlled by turning off the FET Q6 and does not block the current flowing into this FET Q1 to be controlled. In this way, the switch unit 30B turns off the FET Q1 to be controlled based on either of the overcurrent detected by the current sensor 33a to be controlled or the short-circuit result detected by the first short-circuit detector 33d to be controlled.

The second current-determining unit 37c of the switch SW2 determines an overcurrent. The second current-determining unit 37c has a power supply 37g and a comparator 37h. The power supply 37g applies a constant voltage. The power supply 37g is coupled to a first input terminal of the comparator 37h and applies the constant voltage to the first input terminal. The current sensor 34a is coupled to a second input terminal of the comparator 37h and outputs a voltage corresponding to an output current to the second input terminal. The output terminal of the comparator 37h is coupled to the gate terminal of a FET Q8 via a resistance R16. The comparator 37h compares the voltage corresponding to the output current output from the current sensor 34a with the applied voltage applied by the power supply 37g. When the voltage corresponding to the output current is greater than or equal to the applied voltage, the comparator 37f determines that an overcurrent flows into the FET Q2 and turns on the FET Q8 of the IPD controller 37d to turn off the FET Q2. In contrast, when the voltage corresponding to the output current is less than the applied voltage, the comparator 37h determines that no overcurrent flows into the FET Q2, and turns off the FET Q8 of the IPD controller 37d to turn on the FET Q2.

The second short-circuit detector 34d detects a short circuit in the power-supply circuit 1c. The second short-circuit detector 34d has a FET Q7. The FET Q7 is a P-channel-type MOSFET. The drain terminal of the FET Q7 is coupled to the gate terminal of the FET Q8 via a resistance R13. The source terminal of the FET Q7 is coupled to the drain terminal of the FET Q2 and coupled to the source terminal of the FET Q2 via a resistance R12. The gate terminal of the FET Q7 is coupled to the source terminal of the FET Q2 via a resistance R11. When a short circuit occurs on the source terminal side of the FET Q2, the second short-circuit detector 34d turns on the FET Q7. This causes the second short-circuit detector 34d to turn on the FET Q8 of the IPD controller 37d to turn off the FET Q2. When no short circuit occurs on the source terminal side of the FET Q2, the second short-circuit detector 34d turns off the FET Q7. This causes the second short-circuit detector 34d to turn off the FET Q8 of the IPD controller 37d to turn on the FET Q2.

The IPD controller 37d controls the FET Q2. The IPD controller 37d has the FET Q8. The FET Q8 is an N-channel-type MOSFET. The drain terminal of the FET Q8 is coupled to the IPD 34. The source terminal of the FET Q8 is coupled to the ground. The gate terminal of the FET Q8 is coupled to the second current-determining unit 37c and the second short-circuit detector 34d. Specifically, the drain terminal of the FET Q8 is coupled to the driving unit 34b. The gate terminal of the FET Q8 is coupled to the output terminal of the comparator 37h and the drain terminal of the FET Q7. The junction at a point between the drain terminal of the FET Q8 and the driving unit 34b is coupled to the connecting wire Lf via a resistance R14.

When the second current-determining unit 37c to be controlled detects an overcurrent, the IPD controller 37d turns off the FET Q2 to be controlled by turning on the FET Q8 and blocks a current flowing into this FET Q2 to be controlled. In contrast, when the second current-determining unit 37c to be controlled detects no overcurrent, the IPD controller 37d turns on the FET Q2 to be controlled by turning on the FET Q8 and does not block this FET Q2 to be controlled. When the second short-circuit detector 34d to be controlled detects a short circuit, the IPD controller 37d turns off the FET Q2 to be controlled by turning on the FET Q8 and blocks the current flowing into this FET Q2 to be controlled. When the second short-circuit detector 34d to be controlled detects no short circuit, the IPD controller 37d turns on the FET Q2 to be controlled by turning off the FET Q8 and does not block the current flowing into this FET Q2 to be controlled. In this way, the switch unit 30B turns off the FET Q2 to be controlled based on either of the overcurrent detected by the current sensor 34a to be controlled or the short-circuit result detected by the second short-circuit detector 34d to be controlled.

As above, in the switch unit 30B according to the second modification of the embodiment, the switch SW1 to be controlled has the first short-circuit detector 33d to be controlled, which detects a short circuit in the power-supply circuit 1c. The switch SW2 to be controlled has the second short-circuit detector 34d to be controlled, which detects a short circuit in the power-supply circuit 1c. The current sensor 33a to be controlled detects the amperage of the current flowing into the FET Q1 to be controlled. The current sensor 34a to be controlled detects the amperage of the current flowing into the FET Q2 to be controlled. The IPD controller 37b turns off the FET Q1 to be controlled based on either of the amperage detected by current sensor 33a to be controlled or the short-circuit result detected by the first short-circuit detector 33d to be controlled. The IPD controller 37d turns off the FET Q2 to be controlled based on either of the amperage detected by current sensor 34a to be controlled or the short-circuit result detected by the second short-circuit detector 34d to be controlled. When an overcurrent flows, this configuration enables the switch unit 30B to turn off the FETs Q1 and Q2 to be controlled and block the current flowing into the power-supply circuit 1c. When the switch unit 30B detects a short circuit, this unit turns off the FETs Q1 and Q2 to be controlled and blocks the current flowing into the short-circuit point in the power-supply circuit 1c.

Figure 12:
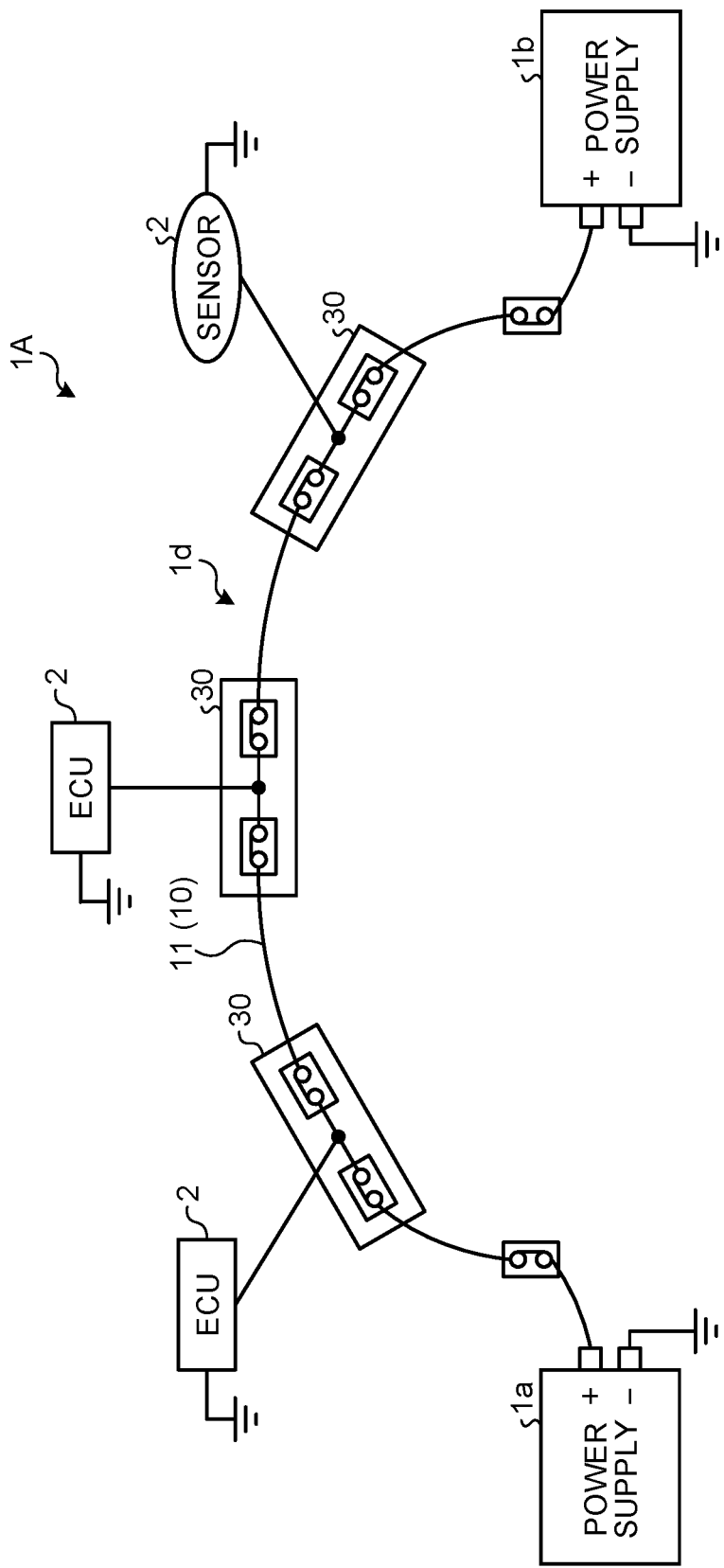
FIG. 12 is a schematic diagram illustrating a configuration example of a power-supply device according to a third modification of the embodiment.

The power-supply device 1A according to a third modification of the embodiment will now be described. FIG. 12 is a schematic diagram illustrating a configuration example of the power-supply device 1A according to the third modification of the embodiment. In the power-supply device 1A according to the third modification, the topology of a power-supply circuit 1d is different from that of the power-supply device 1 according to the embodiment. As illustrated in FIG. 12, the power-supply device 1A according to the third modification includes the power supply 1a, the power supply 1b, and the power-supply circuit 1d.

The power supply 1a, the positive electrode of which is coupled to the power-supply circuit 1d and the negative electrode of which is coupled to the body of the vehicle for body-grounding, supplies power to each load unit 2 of the power-supply circuit 1d. The power supply 1b, the positive electrode of which is coupled to the power-supply circuit 1d and the negative electrode of which is coupled to the body of the vehicle for body-grounding, supplies power to each load unit 2 of the power-supply circuit 1d.

The power-supply circuit 1d includes the electric-wire unit 10, and the switch units 30. The electric-wire unit 10 has one current path 11. This current path 11, one end of which is coupled to the positive electrode of the power supply 1a and the other end of which is coupled to the positive electrode of the power supply 1b, is formed in a linear shape. The current path 11 carries a current of the power supplied from the power supplies 1a and 1b. The switch units 30 are provided for the current path 11, and pass or block a current flowing into each load unit 2 via this current path 11.

As above, the power-supply circuit 1d of the power-supply device 1A according to the third modification has the current path 11 formed in the linear shape. One end of the current path 11 is coupled to the positive electrode of the power supply 1a, and the other end is coupled to the positive electrode of the power supply 1b. This configuration enables the power-supply device 1A to supply power to each load unit 2 coupled to the current path 11.

Figure 13:
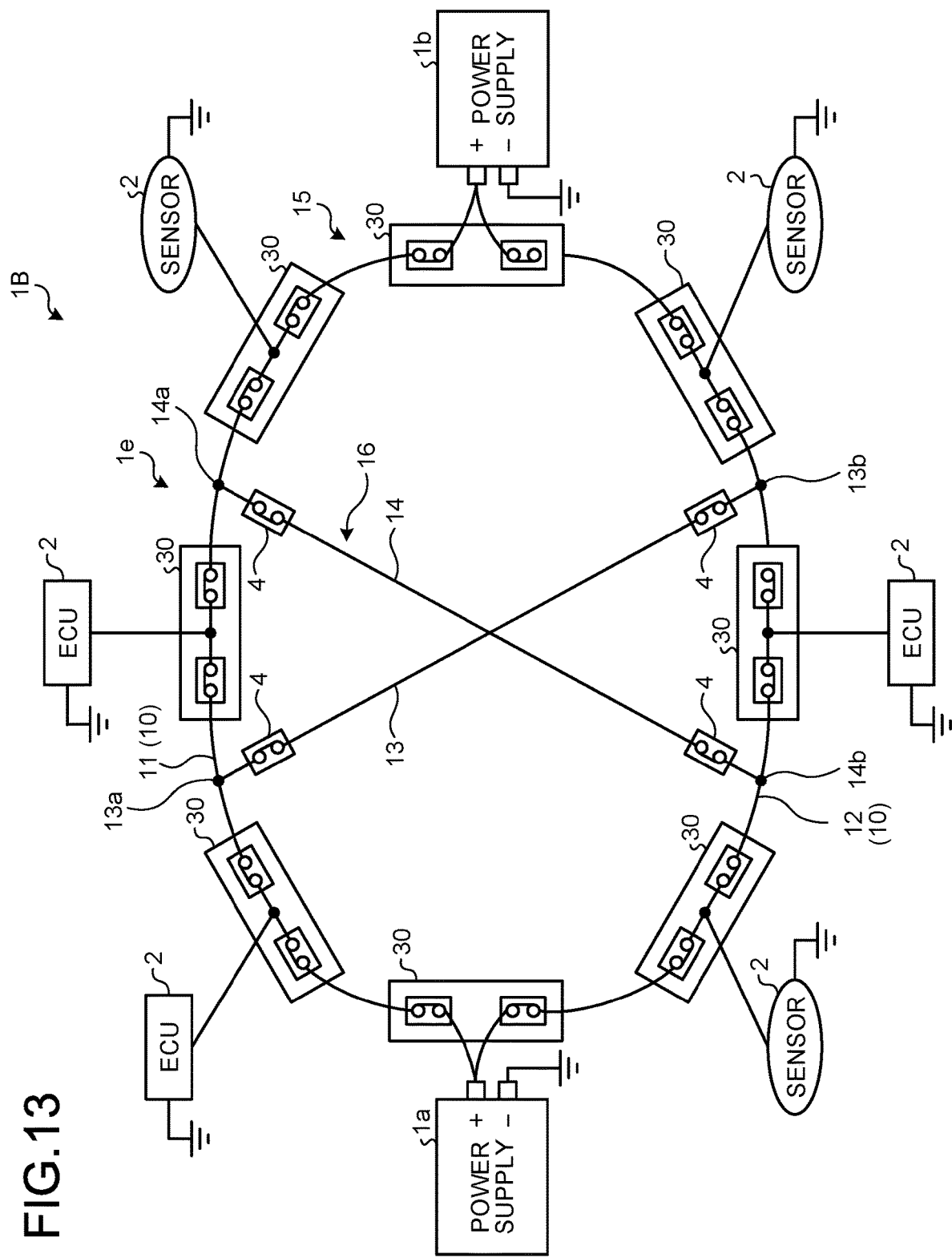
FIG. 13 is a schematic diagram illustrating a configuration example of a power-supply device according to a fourth modification of the embodiment.

A power-supply device 1B according to a fourth modification of the embodiment will now be described. FIG. 13 is a schematic diagram illustrating a configuration example of the power-supply device 1B according to the fourth modification of the embodiment. In the power-supply device 1B according to the fourth modification, the topology of a power-supply circuit 1e is different from that of the power-supply device 1 according to the embodiment. As illustrated in FIG. 13, the power-supply device 1B according to the fourth modification includes the power supply 1a, the power supply 1b, and the power-supply circuit 1e.

The power supply 1a, the positive electrode of which is coupled to the power-supply circuit 1e and the negative electrode of which is coupled to the body of the vehicle for body-grounding, supplies power to each load unit 2 of the power-supply circuit 1e. The power supply 1b, the positive electrode of which is coupled to the power-supply circuit 1e and the negative electrode of which is coupled to the body of the vehicle for body-grounding, supplies power to each load unit 2 of the power-supply circuit 1e.

The power-supply circuit 1e includes the electric-wire unit 10 and the switch units 30. The electric-wire unit 10 has a circular part 15 and a redundant part 16. The circular part 15 is formed in a circular shape by the current paths 11 and 12. One end of the current path 11 is coupled to the positive electrode of the power supply 1a, and the other end is coupled to the positive electrode of the power supply 1b. One end of the current path 12 is coupled to the positive electrode of the power supply 1a, and the other end is coupled to the positive electrode of the power supply 1b. The current paths 11 and 12 form a circular close circuit.

The redundant part 16 is provided inside the circular part 15 and is formed in a linear shape by the current paths 13 and 14. One end 13a of the current path 13 is coupled at a point between adjacent switch units 30, and the other end 13b is coupled at a point between other adjacent switch units 30. The current path 13 is provided with two switches 4. Each switch 4 passes or blocks a current flowing into the current path 13.

The current path 14 is disposed by intersecting the current path 13 inside the redundant part 16. One end 14a of the current path 14 is coupled at a point between adjacent switch units 30, and the other end 14b is coupled at a point between other adjacent switch units 30. The ends 14a and 14b of the current path 14 are coupled at points different from one end 13a and the other end 13b of the current path 13. The current path 14 is provided with two switches 4. Each switch 4 passes or blocks a current flowing into the current path 14. The switch units 30 are provided for the current paths 11 and 12 of the circular part 15, and pass or block a current flowing into each load unit 2 via the current paths 11 and 12.

As above, the power-supply circuit 1e of the power-supply device 1B according to the fourth modification has the circular part 15 and the redundant part 16. The circular part 15 is formed in the circular shape by the current paths 11 and 12. The redundant part 16 is provided inside the circular part 15 and is formed in the linear shape by the current paths 13 and 14. Even if a failure such as any short circuit or disconnection occurs in the circular part 15, this configuration enables the power-supply device 1B to supply power to each load unit 2 via the redundant port 16. This enables its fault tolerance to be improved.

Figure 14:
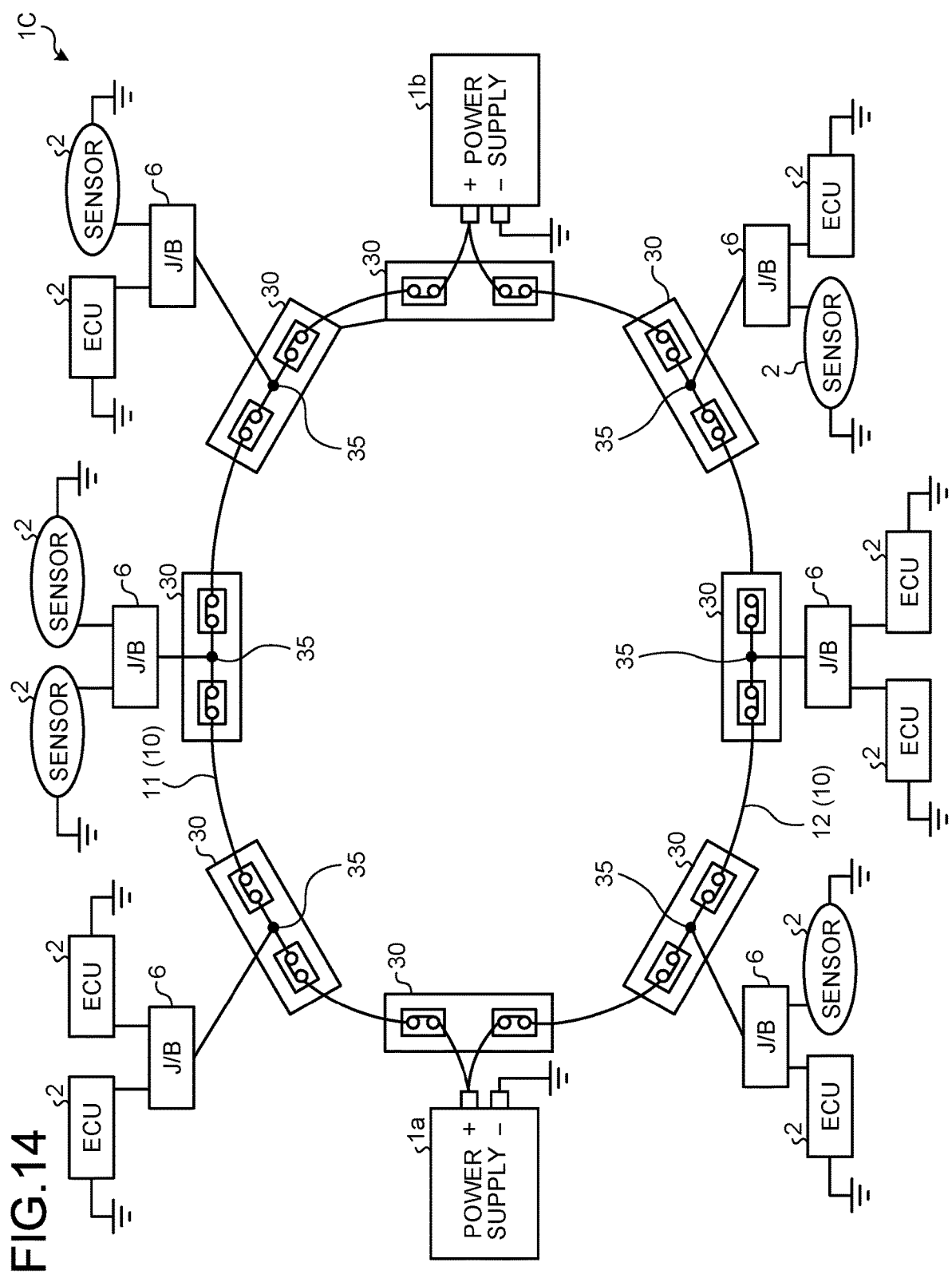
FIG. 14 is a schematic diagram illustrating a configuration example of a power-supply device according to a fifth modification of the embodiment.

A power-supply device 1C according to a fifth modification of the embodiment will now be described. FIG. 14 is a schematic diagram illustrating a configuration example of the power-supply device 1C according to the fifth modification of the embodiment. The power-supply device 1C according to the fifth modification is different from the power-supply device 1 according to the embodiment in that each load unit (ECU, sensor) 2 is coupled to the junction 35 of the switch unit 30 via a J/B6 as an electric junction box (junction box). The J/B6 distributes power supplied from the power supplies 1a and 1b to each load unit 2. In the power-supply device 1C according to the fifth modification, for example, each load unit (sensor, ECU) 2 is coupled to the J/B6, and the J/B6 is coupled to the junction 35 of the switch unit 30, as illustrated in FIG. 14. In this way, the J/B6 of the power-supply device 1C may be coupled to the junction 35 of the switch unit 30, and the load unit 2 may be coupled to the J/B6.

Note that the above description provides the example where the CPU 36 is provided inside each switch unit 30 for every switch unit 30, but is not limited to this. The CPU 36 may be provided outside the switch unit 30 as a common controller. For example, one or more CPUs 36 may be provided outside the switch unit 30 as a common controller, and the CPUs 36 may control the switch units 30.

The description provides the example where the FETs Q1 to Q8 are MOSFETs, but is not limited to this. They may be other switch elements, such as insulated gate bipolar transistors (IGBTs).

The description provides the example where the power supply 1a is a storage battery that can store direct-current power, but is not limited to this. This power supply may be any one that can supply power, and may be a generator, such as an alternator, or a voltage converter, such as a DC/DC converter, for example.

The description gives the example where the switch SW1 includes the IPD 33, but is not limited to this. It may be any other configurations that can detect a short circuit to block a current. For example, the switch SW1 may include a mechanical relay and a current sensor, and may detect a short circuit based on the detection result of the current sensor and block a current by using the mechanical relay. The switch SW2 is also similar.

In each of the switch units, the power-supply device according to the embodiment controls the power-supply circuit based on the detection results detected by the first and second current detectors and thus enables its fault tolerance to faults, such as a short circuit to be improved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A power-supply device comprising:
   a power supply that supplies power;
   a power-supply circuit that is a circuit coupled to the power supply and includes a plurality of switch units, the switch units passing or blocking a current of the power supplied from the power supply; and
   a controller that controls turning on/off the switch units and controls the power-supply circuit; wherein
   each of the switch units include:
      a first switch having a first current blocker that passes or blocks a current flowing from one side in the power-supply circuit and a first current detector that detects a current flowing into the first current blocker;
      a second switch having a second current blocker that is coupled to the first current blocker and passes or blocks a current flowing from another side in the power-supply circuit and a second current detector that detects a current flowing into the second current blocker; and
      a junction that couples a load unit at a point between the first current blocker and the second current blocker, and
   in each of the switch units, the controller controls the power-supply circuit based on detection results detected by the corresponding first current detector and the second current detector,
   the switch unit to be controlled includes a communication unit to be controlled that is capable of communicating with the switch unit to be uncontrolled,
   the first current detector to be controlled detects an amperage of the current flowing into the first current blocker to be controlled, and a first current direction to be controlled that is a direction of the current flowing into the first current blocker to be controlled,
   the second current detector to be controlled detects an amperage of the current flowing into the second current blocker to be controlled, and a second current direction to be controlled that is a direction of the current flowing into the second current blocker to be controlled,
   the communication unit to be controlled receives a first current direction to be uncontrolled that is the direction of the current flowing into the first current blocker of the switch unit to be uncontrolled, and a second current direction to be uncontrolled that is the direction of the current flowing into the second current blocker of the switch unit to be uncontrolled, and
   the controller controls turning on/off the first current blocker to be controlled based on the amperage of the first current blocker to be controlled, the first current direction to be controlled, and the second current direction to be uncontrolled, and controls turning on/off the second current blocker to be controlled based on the amperage of the second current blocker to be controlled, the second current direction to be controlled, and the first current direction to be uncontrolled.

2. The power-supply device according to claim 1, wherein the controller turns off the first current blocker to be controlled when an overcurrent flows into the first current blocker to be controlled and the second current direction to be uncontrolled that is different from the first current direction to be controlled is included, and turns off the second current blocker to be controlled when an overcurrent flows into the second current blocker to be controlled and the first current direction to be uncontrolled that is different from the second current direction to be controlled is included.

3. A power-supply device comprising:
   a power supply that supplies power;
   a power-supply circuit that is a circuit coupled to the power supply and includes a plurality of switch units, the switch units passing or blocking a current of the power supplied from the power supply; and
   a controller that controls turning on/off the switch units and controls the power-supply circuit; wherein
   each of the switch units include:
      a first switch having a first current blocker that passes or blocks a current flowing from one side in the power-supply circuit and a first current detector that detects a current flowing into the first current blocker;
      a second switch having a second current blocker that is coupled to the first current blocker and passes or blocks a current flowing from another side in the power-supply circuit and a second current detector that detects a current flowing into the second current blocker; and
      a junction that couples a load unit at a point between the first current blocker and the second current blocker,
   in each of the switch units, the controller controls the power-supply circuit based on detection results detected by the corresponding first current detector and the second current detector,
   the first switch to be controlled has a first short-circuit detector to be controlled, the first short-circuit detector being configured to detect a short circuit in the power-supply circuit,
   the second switch to be controlled has a second short-circuit detector to be controlled, the second short-circuit detector being configured to detect a short circuit in the power-supply circuit,
   the first current detector to be controlled detects an amperage of the current flowing into the first current blocker to be controlled,
   the second current detector to be controlled detects an amperage of the current flowing into the second current blocker to be controlled, and
   the controller controls turning on/off the first current blocker to be controlled based on the amperage detected by the first current detector to be controlled and a short-circuit result detected by the first short-circuit detector to be controlled, and controls turning on/off the second current blocker to be controlled based on the amperage detected by the second current detector to be controlled and a short-circuit result detected by the second short-circuit detector to be controlled.

4. A power-supply device comprising:
   a power supply that supplies power;
   a power-supply circuit that is a circuit coupled to the power supply and includes a plurality of switch units, the switch units passing or blocking a current of the power supplied from the power supply; and
   a controller that controls turning on/off the switch units and controls the power-supply circuit; wherein
   each of the switch units include:
      a first switch having a first current blocker that passes or blocks a current flowing from one side in the power-supply circuit and a first current detector that detects a current flowing into the first current blocker;
a second switch having a second current blocker that is coupled to the first current blocker and passes or blocks a current flowing from another side in the power-supply circuit and a second current detector that detects a current flowing into the second current blocker; and
a junction that couples a load unit at a point between the first current blocker and the second current blocker,
in each of the switch units, the controller controls the power-supply circuit based on detection results detected by the corresponding first current detector and the second current detector,
the first switch to be controlled has a first short-circuit detector to be controlled, the first short-circuit detector being configured to detect a short circuit in the power-supply circuit,
the second switch to be controlled has a second short-circuit detector to be controlled, the second short-circuit detector being configured to detect a short circuit in the power-supply circuit,
the first current detector to be controlled detects an amperage of the current flowing into the first current blocker to be controlled,
the second current detector to be controlled detects an amperage of the current flowing into the second current blocker to be controlled, and
the controller controls turning on/off the first current blocker to be controlled based on either of the amperage detected by the first current detector to be controlled or a short-circuit result detected by the first short-circuit detector to be controlled, and controls turning on/off the second current blocker to be controlled based on either of the amperage detected by the second current detector to be controlled or a short-circuit result detected by the second short-circuit detector to be controlled.

\* \* \* \* \*